United States Patent
Ren et al.

(10) Patent No.: US 8,592,761 B2
(45) Date of Patent: Nov. 26, 2013

(54) MONOCHROMATOR FOR CHARGED PARTICLE BEAM APPARATUS

(75) Inventors: Weiming Ren, San Jose, CA (US); Zhongwei Chen, San Jose, CA (US)

(73) Assignee: Hermes Microvision Inc., Hsinchu (TW)

( * ) Notice: Subject to any disclaimer, the term of this patent is extended or adjusted under 35 U.S.C. 154(b) by 0 days.

(21) Appl. No.: 13/551,947

(22) Filed: Jul. 18, 2012

(65) Prior Publication Data

US 2012/0318978 A1 Dec. 20, 2012

Related U.S. Application Data

(63) Continuation-in-part of application No. 13/111,851, filed on May 19, 2011, now Pat. No. 8,274,046.

(51) Int. Cl.
*G21K 1/08* (2006.01)
*H01J 37/26* (2006.01)
*H01J 37/20* (2006.01)

(52) U.S. Cl.
USPC .................. 250/305; 250/311; 250/396 R

(58) Field of Classification Search
USPC ............. 250/305, 309–311, 396 R, 396 ML
See application file for complete search history.

(56) References Cited

U.S. PATENT DOCUMENTS

| | | | |
|---|---|---|---|
| 3,995,194 A * | 11/1976 | Blacker et al. ................ 315/16 |
| 5,838,004 A | 11/1998 | Tiemeijer et al. |
| 5,874,739 A * | 2/1999 | Buschbeck et al. ....... 250/396 R |
| 6,452,169 B1 | 9/2002 | Mook |
| 6,489,621 B1 | 12/2002 | Frosien |
| 6,580,073 B2 | 6/2003 | Plies et al. |
| 6,960,763 B2 | 11/2005 | Lopez et al. |
| 7,034,315 B2 | 4/2006 | Henstra et al. |
| 7,468,517 B2 | 12/2008 | Frosien et al. |
| 7,507,956 B2 | 3/2009 | Frosien et al. |
| 7,679,054 B2 | 3/2010 | Frosien et al. |
| 7,960,697 B2 | 6/2011 | Chen et al. |
| 8,183,526 B1 * | 5/2012 | Mankos ..................... 250/305 |
| 8,274,046 B1 * | 9/2012 | Ren et al. ................... 250/305 |
| 2009/0101819 A1 | 4/2009 | Zhou et al. |
| 2010/0187436 A1 | 7/2010 | Frosien et al. |
| 2011/0192975 A1 | 8/2011 | Chen |

\* cited by examiner

*Primary Examiner* — Bernard E Souw
(74) *Attorney, Agent, or Firm* — WPAT, PC; Justin King

(57) ABSTRACT

The monochromator for reducing energy spread of a primary charged particle beam in charged particle apparatus comprises a beam adjustment element, two Wien-filter type dispersion units and an energy-limit aperture. In the monochromator, a dual proportional-symmetry in deflection dispersion and fundamental trajectory along a straight optical axis is formed, which not only fundamentally avoids incurring off-axis aberrations that actually can not be compensated but also ensures the exit beam have a virtual crossover which is stigmatic, dispersion-free and inside the monochromator. The present invention also provides two ways to build a monochromator into a SEM, in which one is to locate a monochromator between the electron source and the condenser, and another is to locate a monochromator between the beam-limit aperture and the objective. The former provides an additional energy-angle depending filtering, and obtains a smaller effective energy spread.

31 Claims, 25 Drawing Sheets

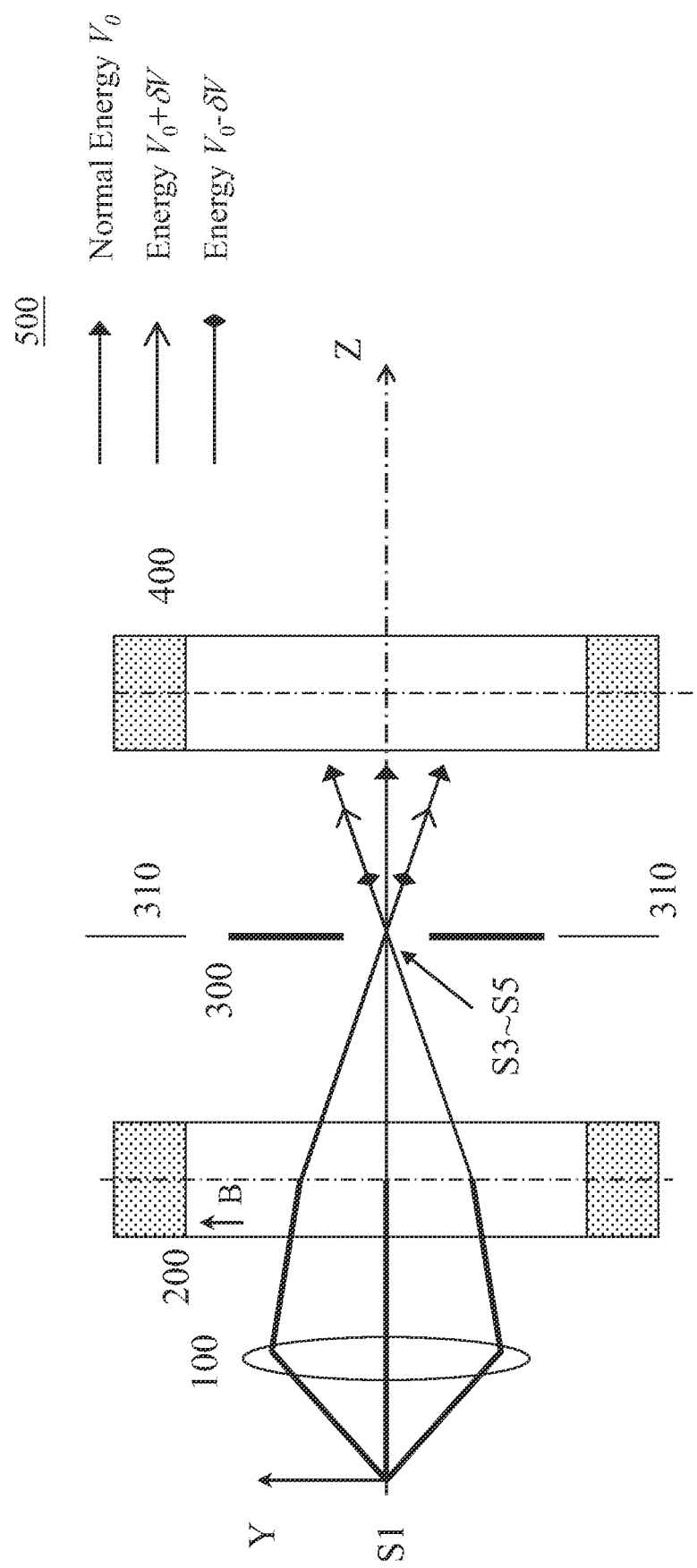

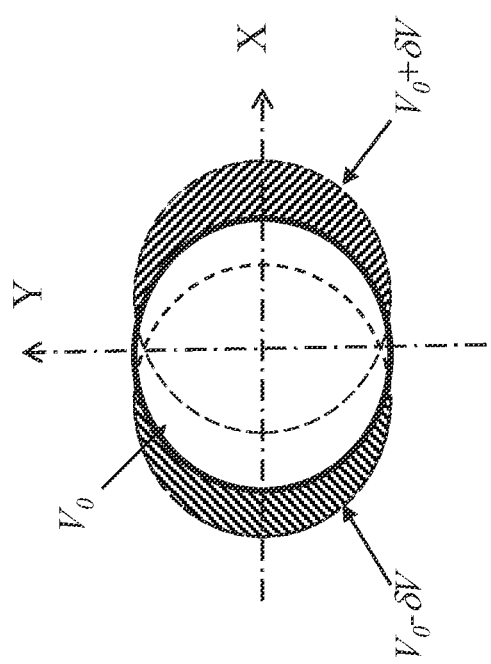

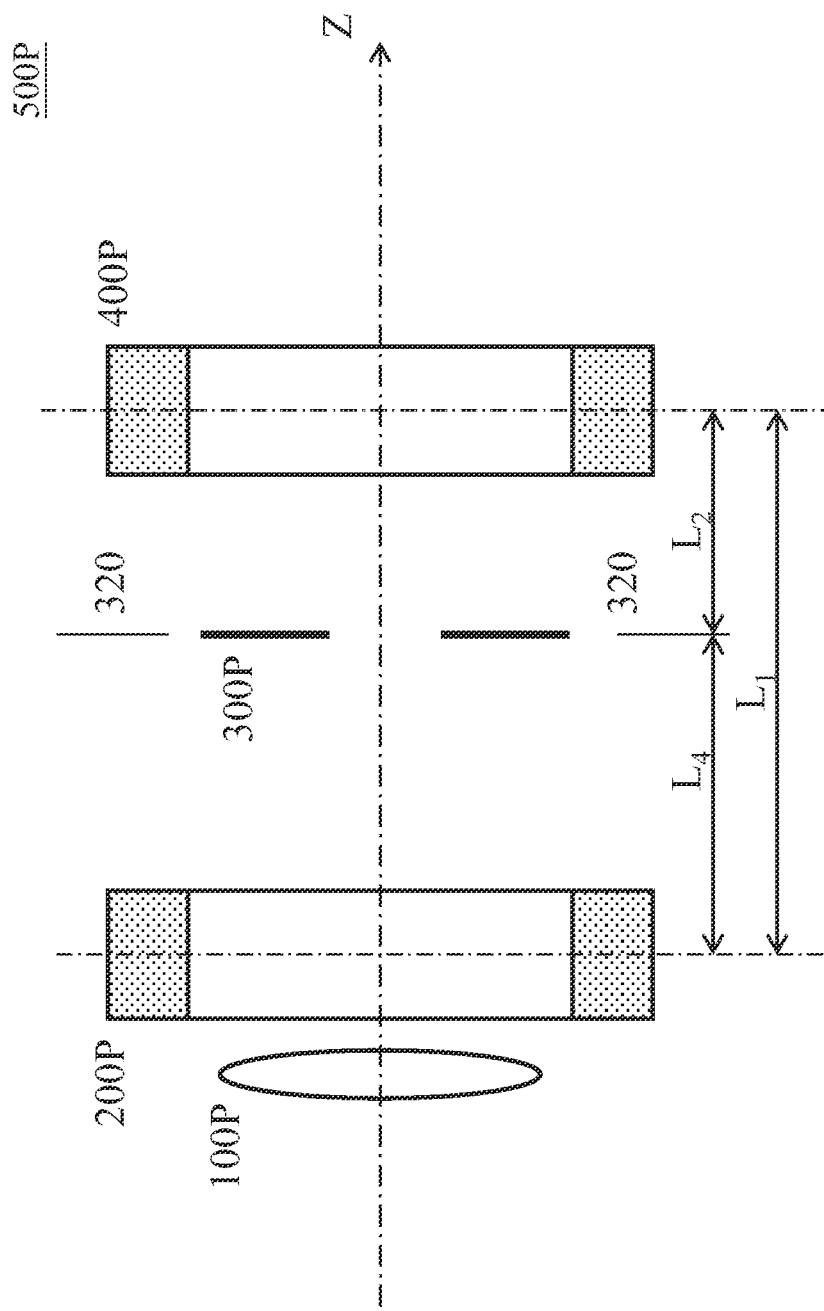

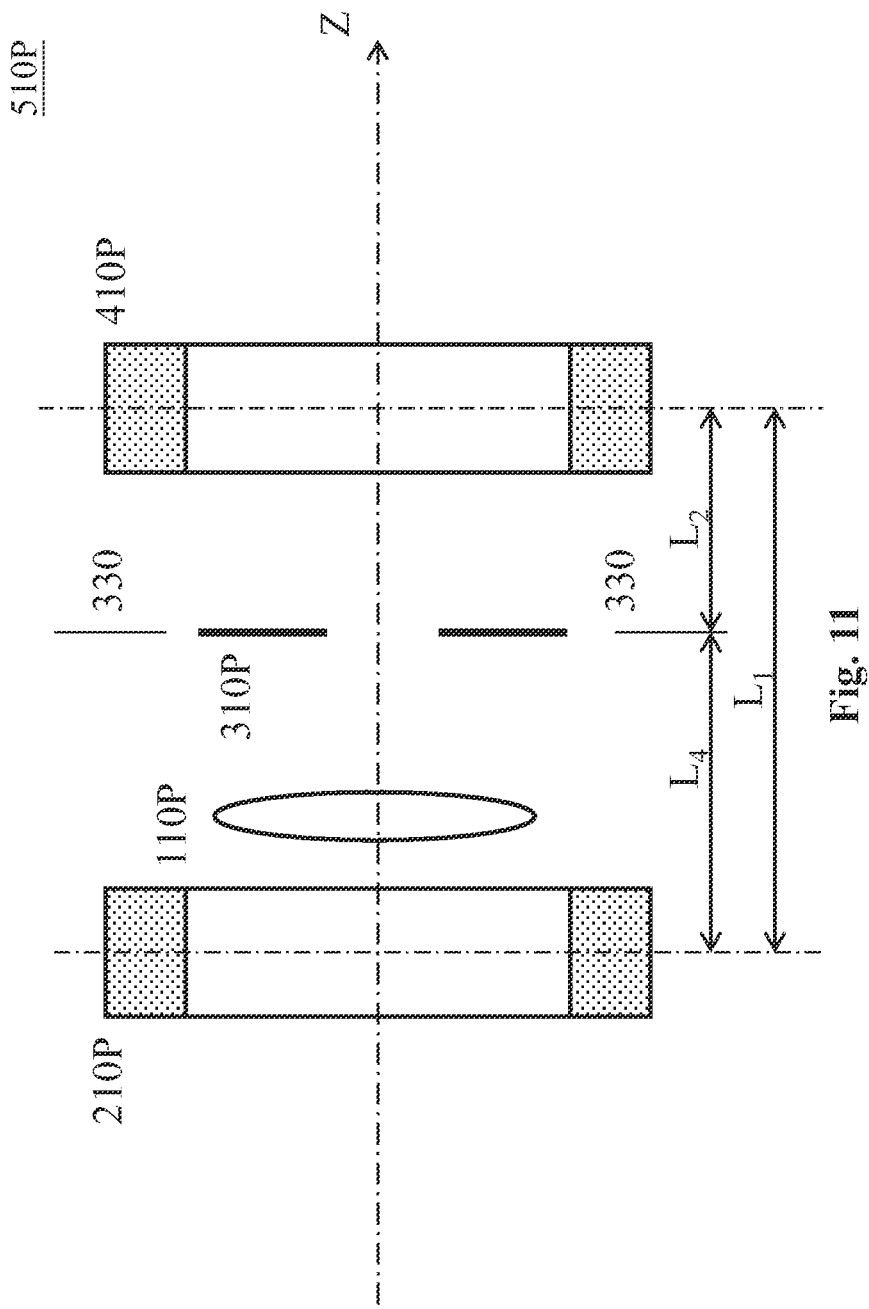

MONOCHROMATOR FOR CHARGED PARTICLE BEAM APPARATUS

CROSS-REFERENCE TO RELATED APPLICATIONS

This application is a continuation-in-part of U.S. application Ser. No. 13/111,851 filed May 19, 2011 now U.S. Pat. No. 8,274,046, the entire contents of which are hereby incorporated by reference.

FIELD OF THE INVENTION

The invention relates to a charged particle beam device, and more particularly to a monochromator for filtering a charged particle beam to a small energy spread. The invention also relates to a charged particle beam apparatus suitable for using such a device. However, it would be recognized that the invention has a much broader range of applicability.

BACKGROUND OF THE INVENTION

In the field of scanning electron microscope (SEM) and the related industrial fields which employ electron microscope principle to observe a sample, such as defect review and defect inspection for yield management in semiconductor manufacture, getting a specimen imaging with high resolution and low radiation damage has been required and pursued.

The only remedy to reduce radiation damage on specimen is to use a low-energy (or typically called as low-voltage in SEM field) electron beam scanning (<5 keV) which limits the beam penetration beneath the specimen surface and the residual charging on the specimen surface. However, the resolution will become worse because a low-energy electron beam forms a probe spot larger than a high-energy electron beam.

The probe spot diameter on specimen surface is determined by electron source size, spherical and chromatic aberrations, diffraction and Coulomb effect in the imaging system. For a low-energy electron beam, the achievable smallest probe spot size is limited by diffraction disc due to its larger de Broglie wavelength $\lambda$ and chromatic aberration due to its larger relative energy spread $dV/V_0$. Both are respectively shown in equations (1.1) and (1.2). Here $C_{CA}$ is chromatic aberration coefficient, $V_0$ and $dV$ are electron energy and energy spread, and $\alpha$ is beam half angle. Obviously, to reduce probe spot size, reducing energy spread is another option as well as reducing chromatic aberration coefficient.

$$D_d = 0.61 \cdot \frac{\lambda}{\alpha} \text{ where } \lambda = \frac{12.26}{\sqrt{V_0}} \quad (1.1)$$

$$D_c = \frac{1}{2} \cdot C_{CA} \cdot \alpha \cdot \frac{dV}{V_0} \quad (1.2)$$

Energy spread of an electron beam comes from the original energy spread generated when electrons are emitted from an electron source and the imposed energy spread generated by statistic interaction among electrons on the way from the source to destination (Boersch effect). Electron energy distribution usually has a shape with a long tail, and the energy spread of a beam is typically expressed in FWHM (Full Width Half Maximum). For Schottky Field Emission Source which is widely used in Low-Voltage SEM (LVSEM), the energy spread dV at cathode is 0.3 eV, and at gun exit it is increased to 0.5~1 eV in dependence upon the beam current. For a low-energy electron beam such as 1 keV, this amount of the energy spread means a relative energy spread $dV/V_0$ much larger than a high-energy beam such as 10 keV.

Many solutions have been provided to reduce the energy spread dV before electrons land on the specimen. In these solutions, magnetic and/or electrostatic deflectors (such as Alpha filter, omega filter and Wien filter) and electrostatic round lenses (such as U.S. Pat. No. 7,034,315) are taken as dispersion elements. These elements in common generate deflection dispersion when deflecting an electron beam. Among all these solutions, only Wien filter has a straight optical axis and does not deflect electrons with normal energy away from the optical axis. This characteristic makes Wien filter is easier in provision and generates no off-axial aberrations which are actually impossible to be completely compensated, and therefore many solutions are provided based on Wien filter.

In a fundamental configuration of a standard Wien filter as shown in FIG. 1, an electrostatic dipole field E in X direction and a magnetic dipole field B in Y direction are superposed perpendicularly to each other, and both are perpendicularly to a straight optical axis Z. An electron beam propagating along the optical axis Z goes through the Wien filter. Wien Condition is only true for the electrons moving in Z direction with a velocity $v_0$ as shown in equation (1.3), where the net Lorenz force F on each electron is zero. For the electron moving in Z direction with a velocity deviation $\delta v$ from velocity $v_0$, it obtains a non-zero net Lorenz force in X direction as shown in equations (1.4) or (1.5) expressing in normal electron energy $V_0$ and energy derivation $\delta V$, and will be deflected in X direction and therefore is diverted away from Z direction. Here e and m are respectively charge and mass of an electron. The deflection angle $\alpha$ depends on energy deviation $\delta V$ and the deflection power K which is related to the magnetic field B and normal energy $V_0$, as shown in equation (1.6). Hence, the Wien filter generates deflection dispersion, and the deflection power K represents the dispersion strength. For sake of clarity, the deflection power K and the deflection direction are respectively called as dispersion power and dispersion direction here. In this case no off-axial aberrations occur for the electrons with velocity $v_0$.

$$\text{Wien Condition: } F(v_0) = F_e + F_m = 0 \text{ or } E = v_0 \cdot B \quad (1.3)$$

$$\text{Dispersion: } F(v_0 + \delta v) = -e \cdot \delta v \cdot B \quad (1.4)$$

$$F(V_0 + \delta V) = -e \cdot \frac{\delta V}{\sqrt{2 \cdot m \cdot V_0}} \cdot B \quad (1.5)$$

$$\alpha = K(B, V_0) \cdot \delta V \quad (1.6)$$

For each electron with normal energy but not moving in YOZ plane, it gains a potential change from the electrostatic field. Therefore, its velocity will be different from $v_0$ when it passes through the Wien filter as shown in equation (1.7) and will obtain a non-zero net Lorenz force as shown in equation (1.8). The net Lorenz force is proportional to electron position x, so a focusing effect in X direction (dispersion direction) exists. The focusing effect in dispersion direction will generate an astigmatic focusing, and simultaneously reduce deflection angles of the off-axis electrons. The latter implies a dispersion power reduction.

$$v_0 - v = -\frac{e \cdot E \cdot x}{m \cdot v_0} \quad (1.7)$$

$$F(x) = -\frac{e^2 \cdot B \cdot E}{\sqrt{2 \cdot m \cdot V_0}} \cdot x \quad (1.8)$$

The Wien filter has been employed as a monochromator or an energy filter in many ways, wherein energy depending filtering and energy-angle depending filtering are two typical ways. In energy depending filtering shown in FIG. 2a, a beam 2 from an electron source 1 is focused by a round lens 10 and/or Wien filter 11 itself (such as U.S. Pat. No. 6,452,169, U.S. Pat. No. 6,580,073, U.S. Pat. No. 6,960,763 and U.S. Pat. No. 7,507,956), and forms an astigmatic image on an energy-limit aperture 12. The electrons with energy $V_0$ forms a sub-beam 3 which is focused onto optical axis, while the electrons with energy $V_0 \pm \delta V$ respectively form sub-beams 4 and 5 which will be respectively deflected in $\pm X$ direction and focused away from the optical axis. As a result, inside the beam 2, all the electrons whose energy deviations are within $\pm \delta V$ will pass through the aperture 12 and the rest will be blocked out.

As a significant advantage, the energy depending filtering will cut off the long tail of electron energy distribution completely. The long tail of energy distribution generates a background in the image and deteriorates the image contrast. As an unignorable disadvantage, the energy depending filtering increases the source size. The image of the electron source 1 on the aperture 12 is the source for the following electron optics, whose size is actually determined by the aperture size. However the practicable aperture size at present ($\geq 100$ nm) is much larger than the size of the original source 1 (virtual source of Schottky Field Emission Source is about 20 nm). In addition, the image on the aperture 12 is a crossover of all electrons, which enhances electron interaction that generates additional energy spread. Although, an astigmatic image is better than a stigmatic image in terms of the electron interaction.

In energy-angle depending filtering (for example, U.S. Pat. No. 6,489,621, U.S. Pat. No. 7,679,054 and U.S. Pat. No. 5,838,004) as shown in FIG. 2b, a beam 2 from an electron source 1 passes through the Wien filter 11. The electrons with energy $V_0$ form a sub-beam 3 which goes straight, and electrons with energy $V_0 \pm \delta V$ respectively form sub-beams 4 and 5 which will be respectively deflected in $\pm X$ direction. The position of each electron on energy-angle-limit aperture 12 depends on its energy and incident angle into the Wien filter 11 as well. Therefore, the aperture 12 not only blocks out all the electrons whose energy deviations are not within $\pm \delta V$, but also some of the electrons which have larger incident angle even so their energy deviations are within $\pm \delta V$.

The deflection angle $\alpha$ with respect to the energy deviation $\delta V$ must be at least larger than double incident half angle $\beta$ to clear filter out charged particles with energy deviation $\delta V$. This requires dispersion power of the Wien filter to be strong enough or divergence of the incident beam to be small enough. Increasing dispersion power of the Wien filter will increase deflection angle, but at the same time enhance its focusing effect which will in turn decrease the deflection angle and limits its achievable maximum of deflection angle. Restraining divergence of the incident beam will either limit the beam current or enhance electron interaction which in turn increases energy spread of the beam. Another unignorable disadvantage is the original source 1 is changed to be a larger virtual source from 14 to 15 for the following electron optics.

Many improvement methods have been provided to solve the problems mentioned above. For the energy-angle depending filtering, one method is to use a round lens to image the original source onto the Wien filter center (such as U.S. Pat. No. 7,468,517). This minimizes the Wien filter effect on source size, but adds a real crossover. Another method is to use a second Wien filter to compensate the residual effect of the first Wien filter (such as U.S. Pat. No. 6,489,621, U.S. Pat. No. 7,679,054). Although this method does not generate a real crossover, it generates a virtual crossover far away from the following electron optics which will incur large aberrations due to a large increase in beam size.

For the energy depending filtering, the methods with one (as shown in FIG. 3a and FIG. 3b) or more additional Wien filter 21 to compensate the residual effect of the first Wien filter 11 after the energy-limit aperture filter 12 are provided in many documents (such as U.S. Pat. No. 6,960,763, U.S. Pat. No. 6,580,073 and U.S. Pat. No. 7,507,956). In these solutions, a stigmatic and dispersion-free crossover 7, i.e. an additional real crossover after the first real astigmatic crossover 6 at the energy-limit aperture 12, is formed after the last Wien filter 21. This not only increases the energy spread after the energy filtering in terms of electron interaction, but also lengthens the total length of SEM by at least the length 8 of the monochromator.

The present invention will provide a solution to solve the problems in the energy depending filtering and energy-angle depending filtering. Instead of forming a real stigmatic crossover of an incident charged particle beam after the monochromator, it forms a virtual stigmatic and dispersion-free crossover inside the monochromator. Thereafter it provides an effective way to improve the imaging resolution of low-Voltage SEM and the related apparatuses which are based on LVSEM principle.

SUMMARY OF THE INVENTION

The object of this invention is to provide a monochromator for reducing energy spread of a primary charged particle beam in charged particle apparatus. By specifically forming a double symmetry or a dual proportional-symmetry in deflection dispersion and fundamental trajectory along a straight optical axis with respect to a plane inside a particle-blockage unit, this monochromator makes an incident charged particle beam coming from a charged particle source exit it with a reduced energy spread as well as keeping the effective crossover diameter and propagation direction unchanged. Hence, this invention provides an effective way to improve the imaging resolution of Low-Voltage SEM and the related apparatuses which are based on LVSEM principle, such as the defect inspection and defect review in semiconductor yield management.

Accordingly, the present invention provides an embodiment of a monochromator, which comprises a first dispersion unit and a second dispersion unit both aligned with a straight optical axis of the monochromator and configured to in sequence deflect a charged particle beam with a normal energy and an energy spread, a particle-blockage unit between the first and second dispersion units, and a beam adjustment element aligned with the straight optical axis and configured to focus the charged particle beam to form a real crossover at a plane inside the particle-blockage unit. The charged particle beam propagates along the optical axis and includes charged particles with the normal energy passing straight through each dispersion unit and charged particles with energy deviations from the normal energy being deflected by the each dispersion unit in a same direction as a dispersion direction thereof. A deflection angle of each charged particle generated by the each dispersion unit depends on a dispersion power thereof and energy deviation of that each charged particle. The dispersion directions of the first and second dispersion units are the same. Inside the real crossover, each particle with energy deviation has a position shift due to that deflection angle generated by the first dispersion unit. The particle-blockage unit cuts off particles located outside a spatial area of the real crossover. A virtual crossover is formed inside the monochromator after the charged particle beam is dispersed by the second dispersion unit.

The dispersion powers of the two dispersion units have a proportional relationship so as to make the virtual crossover free of first-order dispersion and at or close to the plane. The first dispersion unit may comprise a first Wien filter and a first stigmator which compensates astigmatism generated by the first Wien filter, and the second dispersion unit may comprise a second Wien filter and a second stigmator which compensates astigmatism generated by the second Wien filter. The beam adjustment element can be on a beam entrance side of the first dispersion unit, and can be a round lens. An exit energy spread of the charged particle beam after exiting from the monochromator can be changed by simultaneously changing the dispersion powers of the first and second dispersion units in terms of the proportional relationship and a focusing power of the beam adjustment element.

The particle-blockage unit may use an energy-limit aperture to cut off particles. Furthermore, the particle-blockage unit may have multiple energy-limit apertures with different aperture sizes in the dispersion direction of the first dispersion unit so that the exit energy spread of the charged particle beam after exiting from the monochromator can be changed by using a different energy-limit aperture.

The particle-blockage unit may use a first knife-edge to cut off particles, and the exit energy spread of the charged particle beam after exiting from the monochromator can be changed by adjusting a position of the first knife-edge in the dispersion direction of the first dispersion unit. The particle-blockage unit may further use a second knife-edge to cut off particles, and the exit energy spread of the charged particle beam after exiting from the monochromator can be changed by adjusting one or both of positions of the two knife-edges in the dispersion direction of the first dispersion unit.

The beam adjustment element can be between the first dispersion unit and the particle-blockage unit.

The present invention also provides a charged particle beam apparatus which comprises a charged particle source adapted to provide a primary charged particle beam propagating along a straight optical axis of the apparatus, a condenser aligned with the optical axis and constructed to focus the primary charged particle beam, an objective lens aligned with the optical axis and able to focus the primary charged particle beam onto a surface of a specimen which emanates secondary charged particles, a detector configured to receive the secondary charged particles, and a monochromator aligned with the optical axis and disposed between the charged particle source and the objective lens to reduce an energy spread of the primary charged particle beam. The monochromator can be referred to the foregoing embodiment.

The dispersion powers of the two dispersion units of the monochromator have a proportional relationship so that the virtual crossover of the charged particle beam is free of first-order dispersion and at or close to the plane. The beam adjustment element of the monochromator can be on a beam entrance side of the first dispersion unit of the monochromator. The beam adjustment element of the monochromator can be a round lens. The first dispersion unit of the monochromator may comprise a first Wien filter and a first stigmator which compensates astigmatism generated by the first Wien filter, and the second dispersion unit of the monochromator may comprise a second Wien filter and a second stigmator which compensates astigmatism generated by the second Wien filter. An exit energy spread of the charged particle beam after exiting from the monochromator can be changed by simultaneously changing the dispersion powers of the first and second dispersion units in terms of the proportional relationship and a focusing power of the beam adjustment element, or by adjusting the particle-blockage unit to choose the corresponding position and dimensions of the spatial area of the real crossover.

The charged particle beam apparatus may further comprise a first plate with a first beam-limit aperture between the charged particle source and the condenser, and a second plate with a second beam-limit aperture between the condenser and the objective lens, wherein the first and second beam-limit apertures are aligned with the optical axis of the apparatus. The monochromator can be between the first plate and the condenser or between the second plate and the objective lens.

The present invention still provides a monochromator which comprises a first dispersion unit and a second dispersion unit both aligned with a straight optical axis of the monochromator and configured to in sequence deflect charged particles of the charged particle beam propagating along the optical axis, and a particle-blockage unit between the first and second dispersion units. Each of the dispersion units has a dispersion power in a dispersion direction, thereby deflecting each particle a deflection angle which depends on the dispersion power and difference between energy of the particle and a normal energy of the charged particle beam. The dispersion directions of the first and second dispersion units are the same. The charged particle beam forms a real crossover at a plane inside the particle-blockage unit, and inside the real crossover each particle with energy deviation has a position shift due to the deflection angle generated by the first dispersion unit. The particle-blockage unit cuts off particles located outside a spatial area of the real crossover, and the dispersion power of the second dispersion unit makes the charged particle beam form a virtual crossover free of first-order dispersion and at or close to the plane.

The particle-blockage unit may use an aperture, or one or two knife-edges to cut off particles.

The present invention further provides a method for energy-filtering a charged particle beam, which comprises steps of providing a particle-blockage means cutting off particles outside a spatial area of the charged particle beam, providing a dispersion means generating a dispersion power in a dispersion direction so as to deflect each particle of the charged particle beam a deflection angle which depends on said dispersion power and difference between energy of said each particle and a normal energy of the charged particle beam, using the dispersion means to form a dual proportional-symmetry which comprises a proportional-symmetry in dispersion power distribution and a proportional-anti-symmetry in trajectory distribution of a charged particle having a normal energy both with respect to a plane. The dual proportional-symmetry at first makes the charged particle beam form a real crossover at the plane and with a particle position distribution in dependence upon energy distribution of the charged particle beam, and the particle-blockage means makes particles outside a spatial area of the real crossover blocked out. The dual proportional-symmetry then makes the charged particle beam form a virtual crossover which is free of first-order dispersion and has a reduced energy spread.

The virtual crossover can be at or close to the plane.

The present invention further provides a method for reducing an energy spread of a charged particle beam, which comprises a step of dispersing the charged particle beam, wherein each particle thereof obtains a deflection angle in dependence upon energy deviation thereof from a normal energy of the charged particle beam. Next, the dispersed charged particle beam is focused to form a real crossover. Then, particles outside a specific spatial area of the real crossover are blocked out. Finally, non-blocked charged particle beam is dispersed so as to form a virtual crossover free of first-order dispersion.

The virtual crossover can be at or close to the real crossover.

BRIEF DESCRIPTION OF THE DRAWINGS

The present invention will be readily understood by the following detailed description in conjunction with the accompanying drawings, wherein like reference numerals designate like structural elements, and in which:

FIGS. 6a~6f show schematic representations of the functions (XOZ, YOZ planes) of a monochromator shown in FIG. 5 in accordance with the present invention;

FIGS. 7a~7c show schematic representations of building a monochromator into a SEM in accordance with a second embodiment of the present invention;

FIG. 10 shows a schematic representation of a monochromator for charged particle apparatus in accordance with a fourth embodiment of the present invention;

FIG. 11 shows a schematic representation of a monochromator for charged particle apparatus in accordance with a fifth embodiment of the present invention.

DETAILED DESCRIPTION OF THE INVENTION

Figure 1:
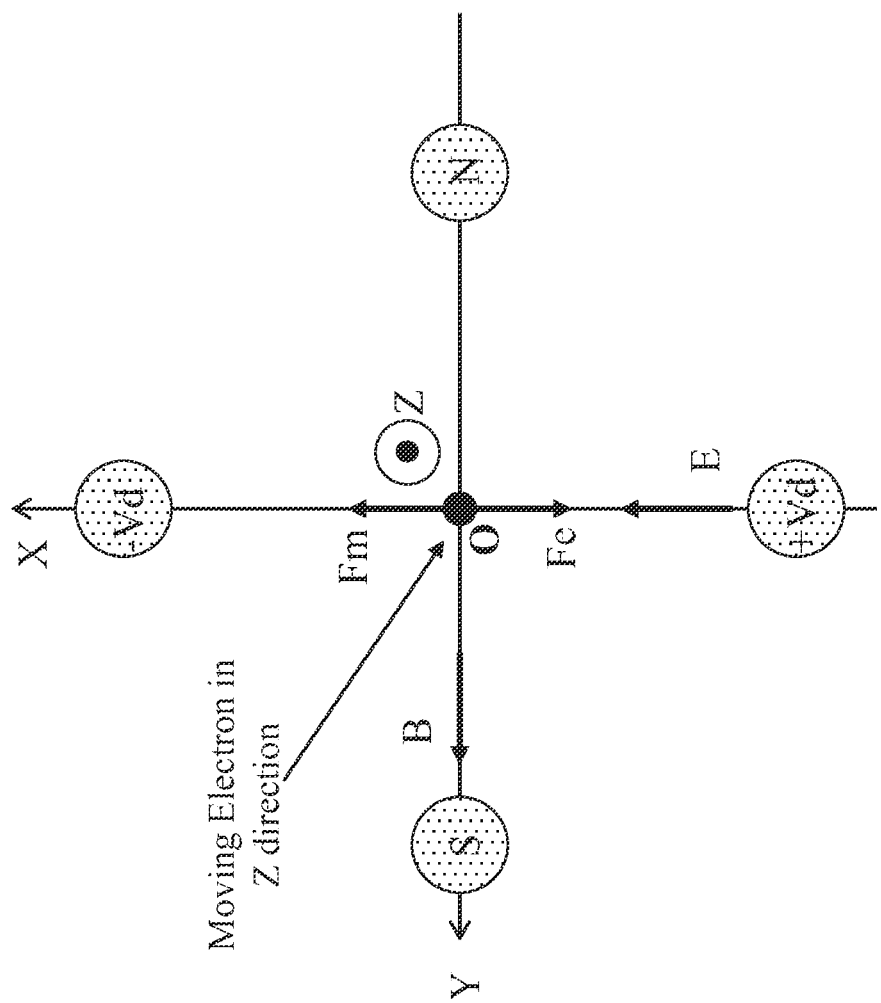
FIG. 1 shows a fundamental configuration of a Wien filter.
Figure 2A:
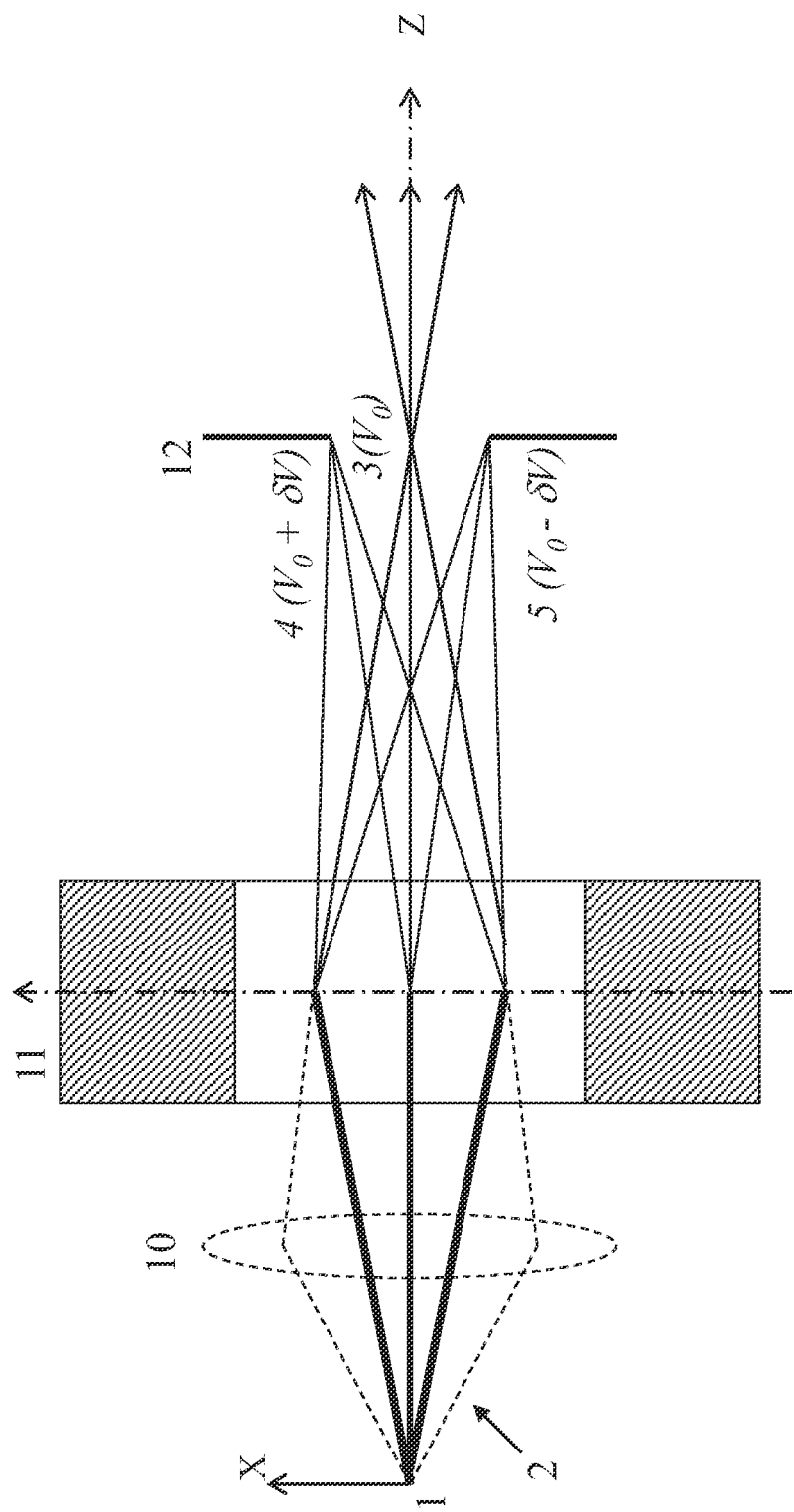
FIG. 2a shows a schematic representation of a monochromator using Wien filter as dispersion element.
Figure 2B:
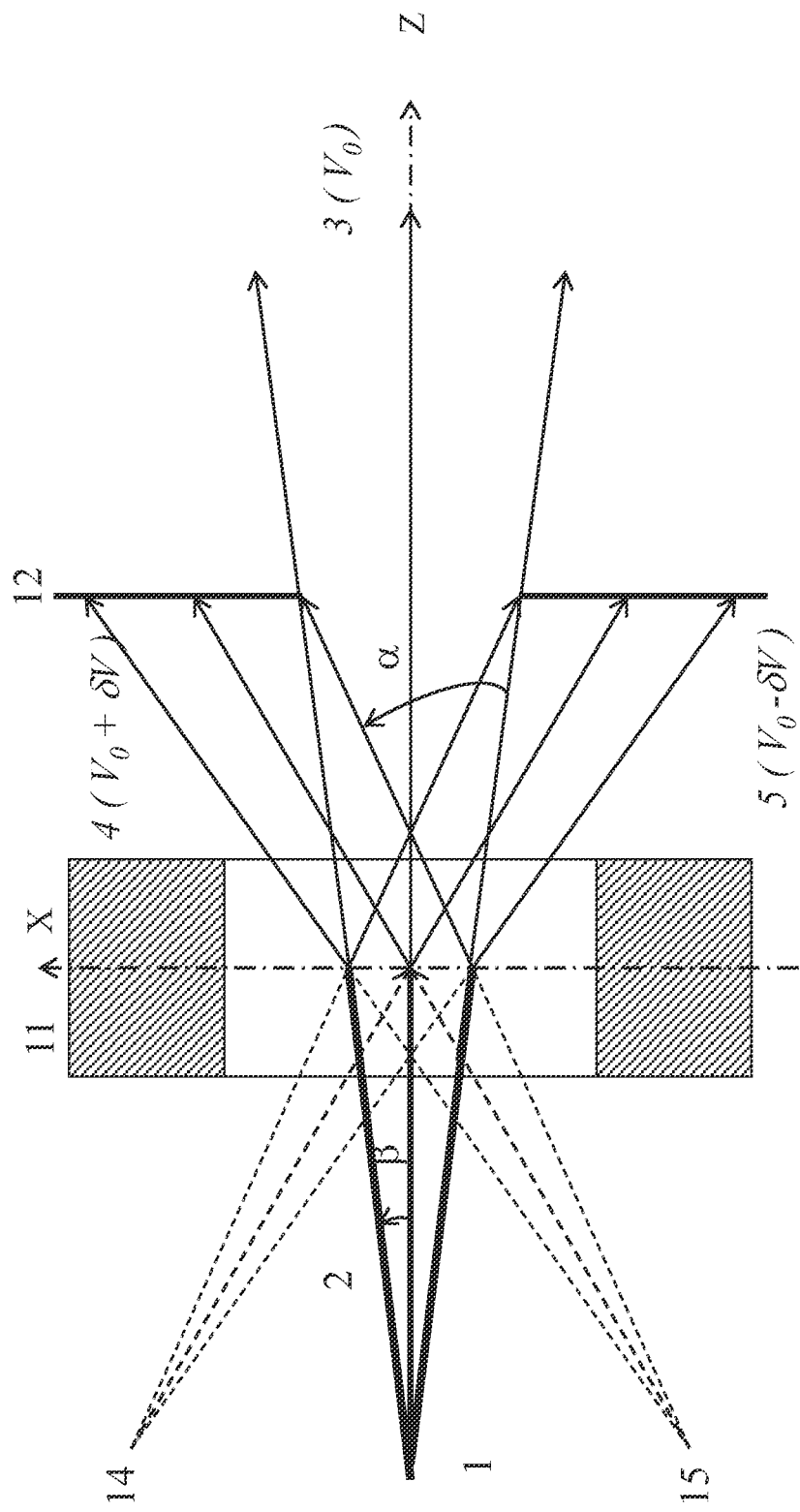
FIG. 2b shows a schematic representation of a monochromator using Wien filter as dispersion element.
Figure 3A:
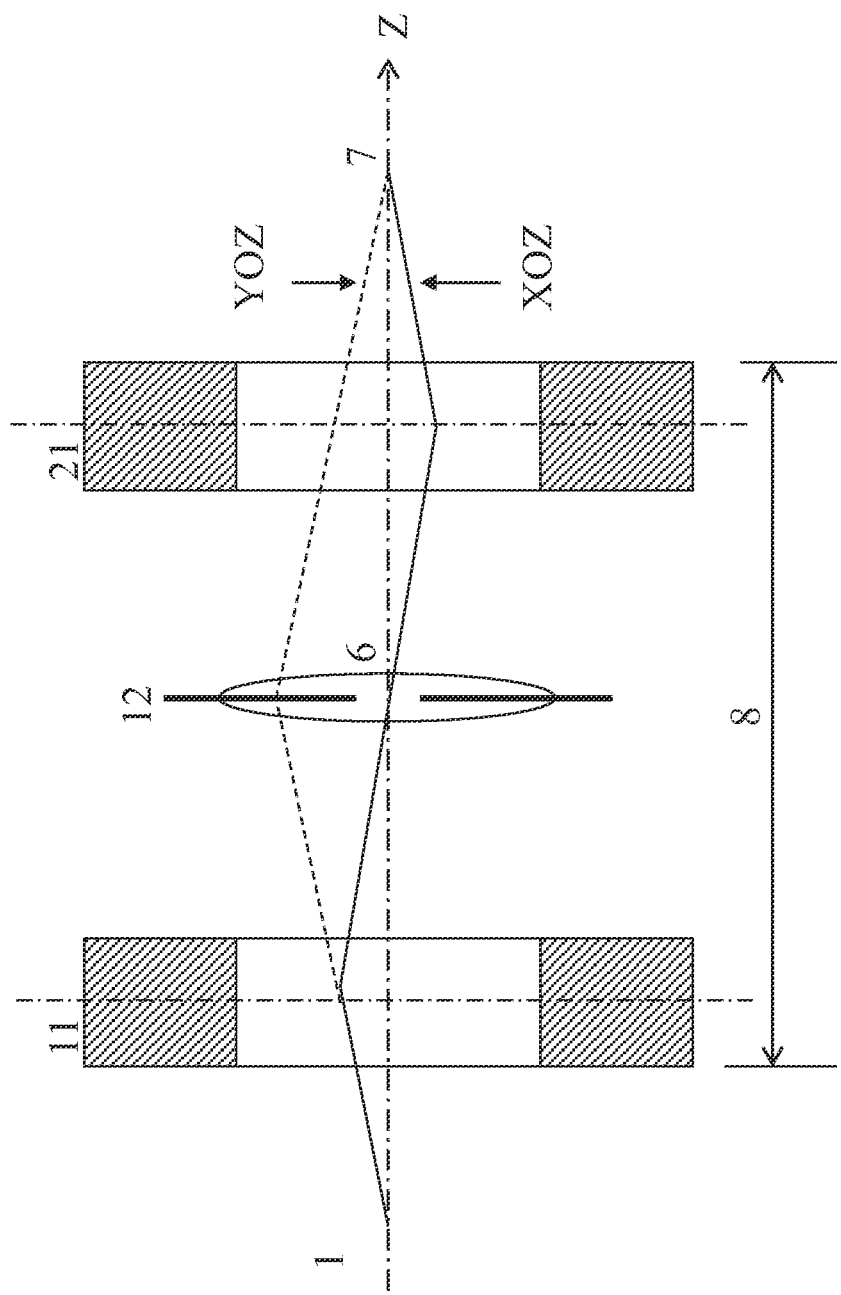
FIG. 3a shows a schematic representation of a monochromator using two Wien filters.
Figure 3B:
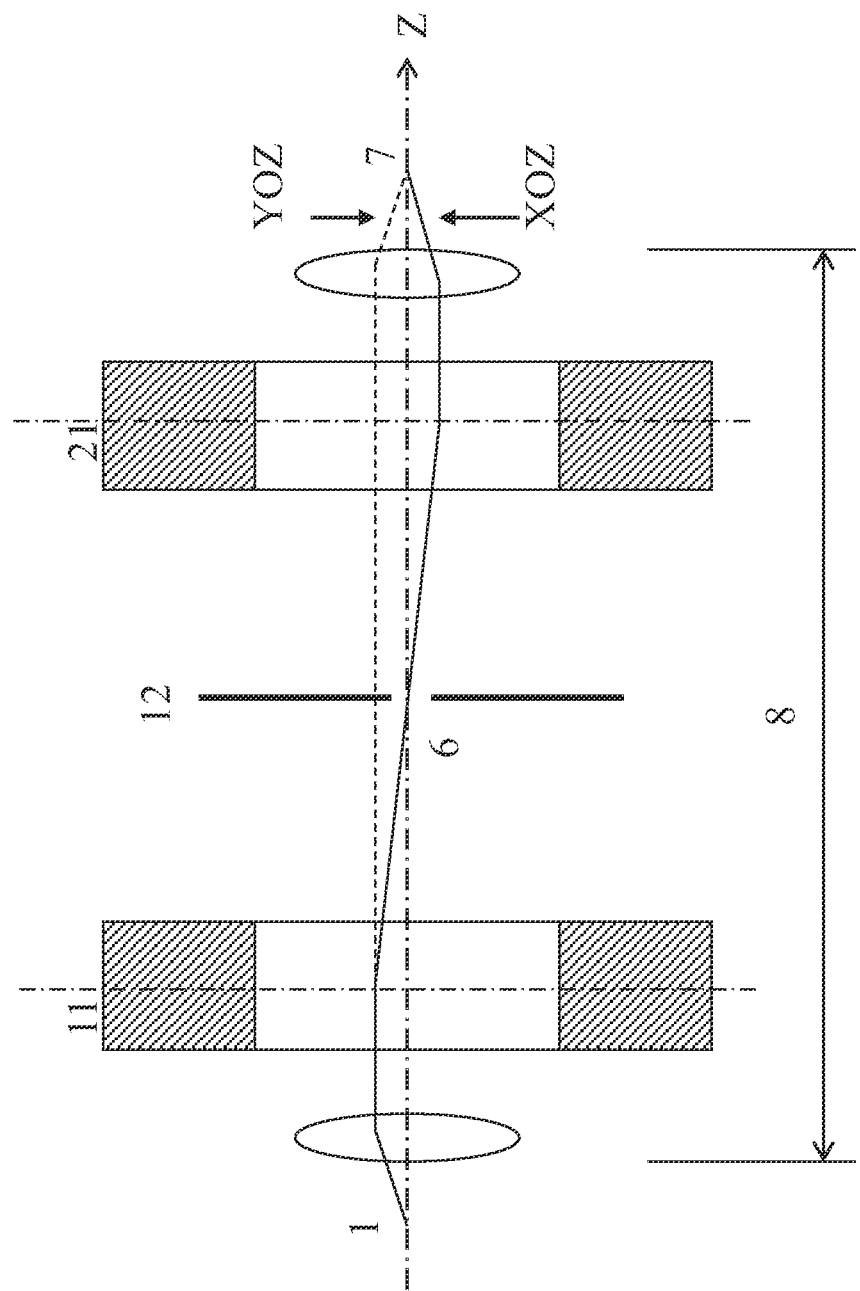
FIG. 3b shows a schematic representation of a monochromator using two Wien filters.

Various example embodiments of the present invention will now be described more fully with reference to the accompany drawings in which some example embodiments of the invention are shown. Without limiting the scope of the protection of the present invention, all the description and drawings of the embodiments will exemplarily be referred to an electron source and scanning electron microscope. However, the embodiments are not to be used to limit the present invention to specific charged particle sources and specific electron microscope field.

The descriptions below will focus on using electron beam, which is a kind of charged particles. In the drawings, relative dimensions of each component and among every component may be exaggerated for clarity. Within the following description of the drawings the same reference numbers refer to the same components or entities, and only the differences with respect to the individual embodiments are described.

Figure 4A:
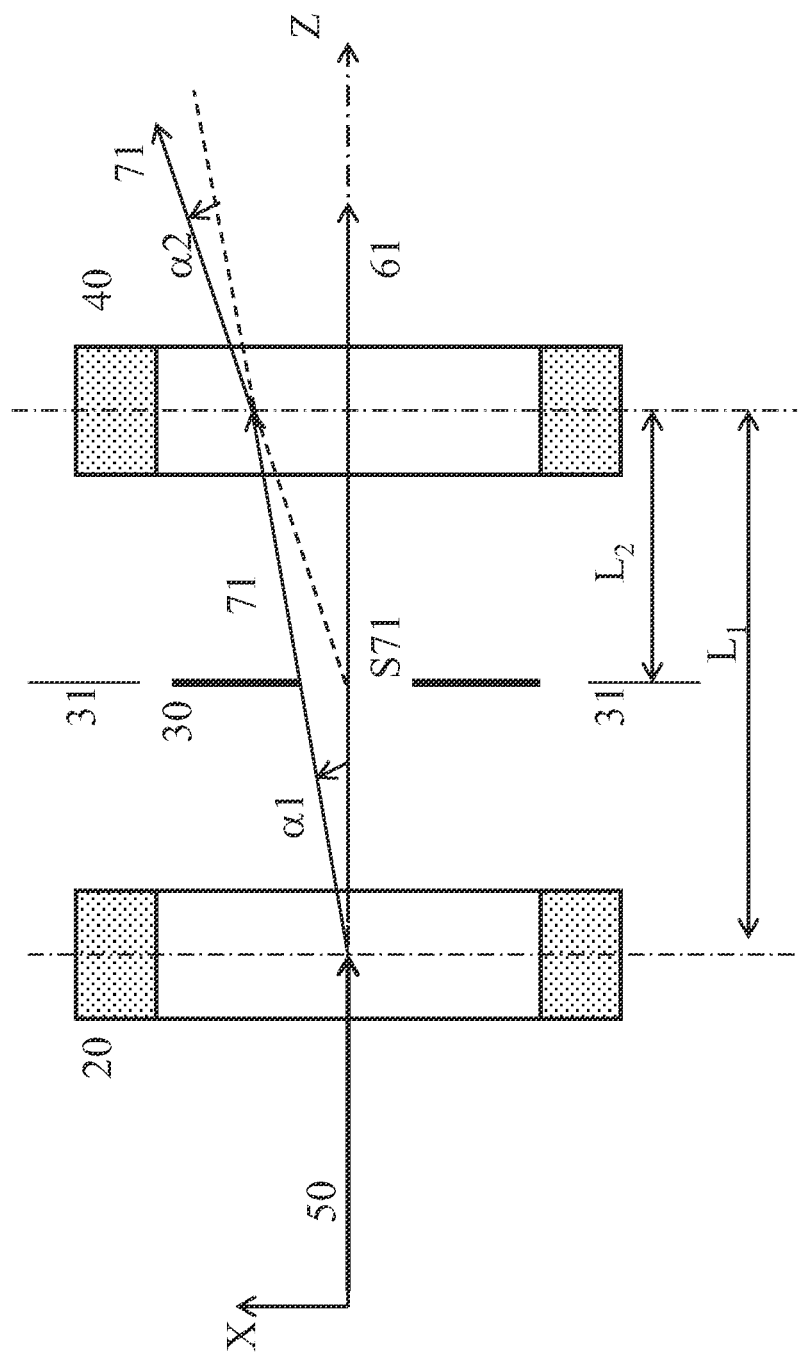
FIG. 4a shows a schematic representation of symmetry of deflection dispersion in accordance with the present invention.
Figure 4B:
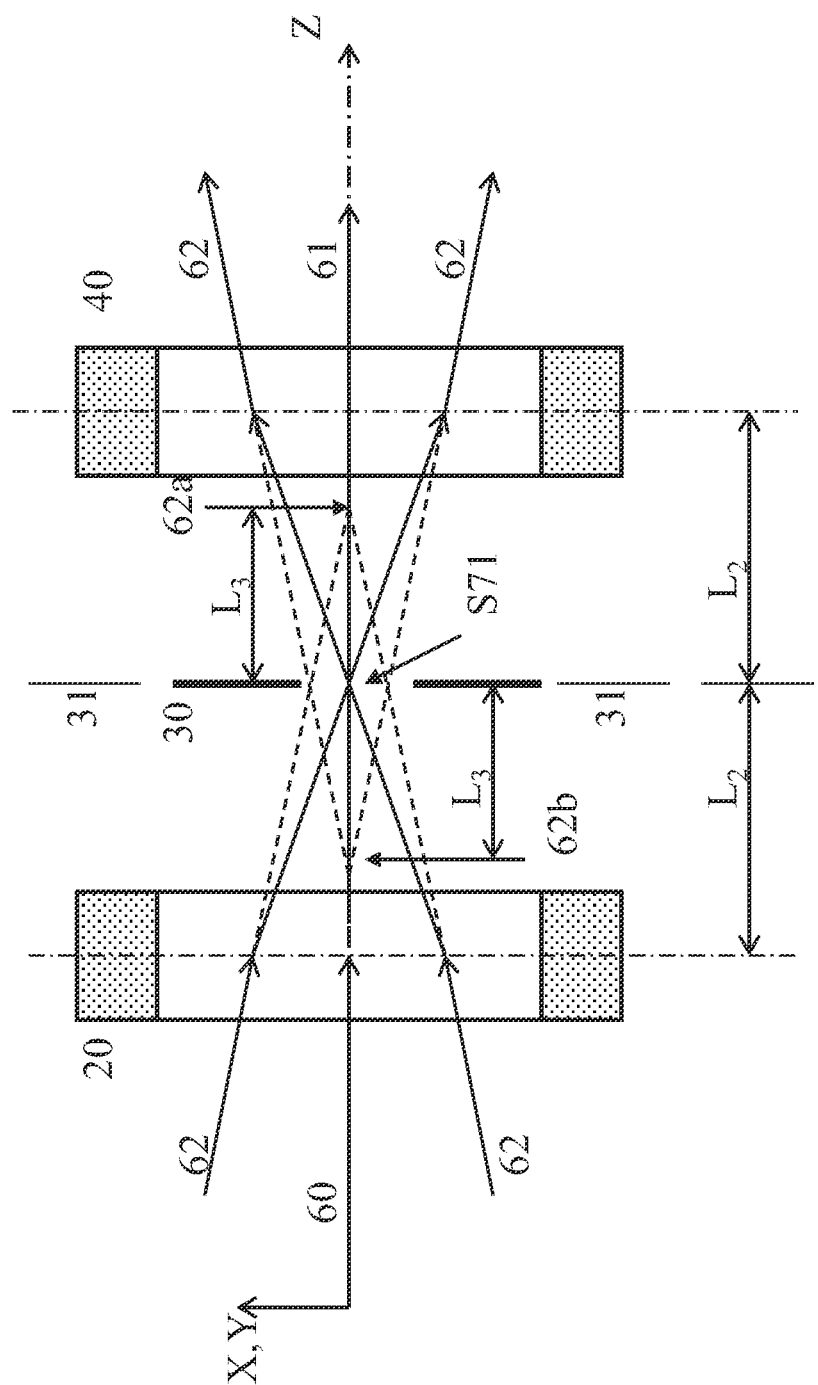
FIG. 4b shows a schematic representation of anti-symmetry of fundamental trajectory in accordance with the present invention.

This invention provides a Wien filter type monochromator with the double symmetry at first. As shown in FIG. 4a and FIG. 4b, the double symmetry is realized by two identical dispersion units (20 and 40) symmetrically located on each side of an energy-limit aperture (30). Each of the two identical dispersion units generates deflection dispersion on the charged particles with an energy deviation from a normal energy and focuses the off-axis charged particles. On the one hand, the two identical dispersion units generate two equal deflection angles ($\alpha 1 = \alpha 2$) on the charged particles with an energy deviation from a normal energy in a same direction. In this case, the deflection dispersion exhibits symmetry with respect to the energy-limit aperture (30) as shown in FIG. 4a. On the other hand, the two identical dispersion units equally focus the off-axis charged particles, and the first dispersion unit (20) makes the charged particles with the normal energy go through the center of the energy-limit aperture (30). In such a case the trajectory of each off-axis particle with normal energy shows anti-symmetry with respect to the energy-limit aperture (30) as shown in FIG. 4b. The double symmetry realizes energy depending filtering, and at the same time ensures the exit charged particle beam has a virtual crossover which is inside the monochromator and free from the first-order dispersion and astigmatism.

Each dispersion unit comprises a Wien filter and a stigmator, and the electrostatic and magnetic fields of both are superposed along the optical axis. For a charged particle beam with a normal energy and a certain energy spread, the Wien filter generates a desired dispersion power which changes with its dipole magnetic and electrostatic field strengths and an undesired astigmatism focusing power which changes with the dispersion power, as shown in the equations (1.3)~(1.8). The stigmator is controlled to generate an astigmatism power to compensate the astigmatism focusing power of the Wien filter. The exit beam from each dispersion unit can be complete astigmatism free because the compensation is finished just where the astigmatism is generated. Consequently, each dispersion unit has an independently changeable dispersion power and a dependently changing stigmatic focusing power.

In accordance with the astigmatism compensation, the dispersion power reduction due to Wien filter focusing effect in dispersion direction is weakened because of the negative focusing power generated by the stigmator in dispersion direction. The energy spread of the charged particle beam passing through the energy-limit aperture is determined by the dispersion power of the first dispersion unit (20) and the size (in dispersion direction) of the energy-limit aperture (30), so the energy spread of the exit charged particle beam can be changed by changing the dispersion power and/or changing the energy-limit aperture size in dispersion unit. The former can be realized by adjusting the electrical excitation exerted on the Wien filter, and therefore can be continuous. However, the change of the dispersion power will incur the change of the stigmatic focusing power, which will break the anti-symmetry in fundamental trajectory and therefore ruin the cancellation of the aberrations generated by the two dispersion units (20 and 40).

To keep the double symmetry when the dispersion power is changed or the incident charged particle beam is changed, one beam adjustment element is set up in front of the two dispersion units. The beam adjustment element is a magnetic or electrostatic round lens whose focusing power is changeable. The beam adjustment element acts as a changeable beam adaptor. Its focusing power is adjusted to keep the charged particle beam have a real crossover at the energy-limit aperture center (which is at S71 in FIG. 4*b*) when the crossover and/or normal energy of the incident charged particle beam may be changed for some good reasons, and/or the dispersion power of the first dispersion unit may be changed to get a desired energy spread reduction for a specific size of the energy-limit aperture.

Figure 5:
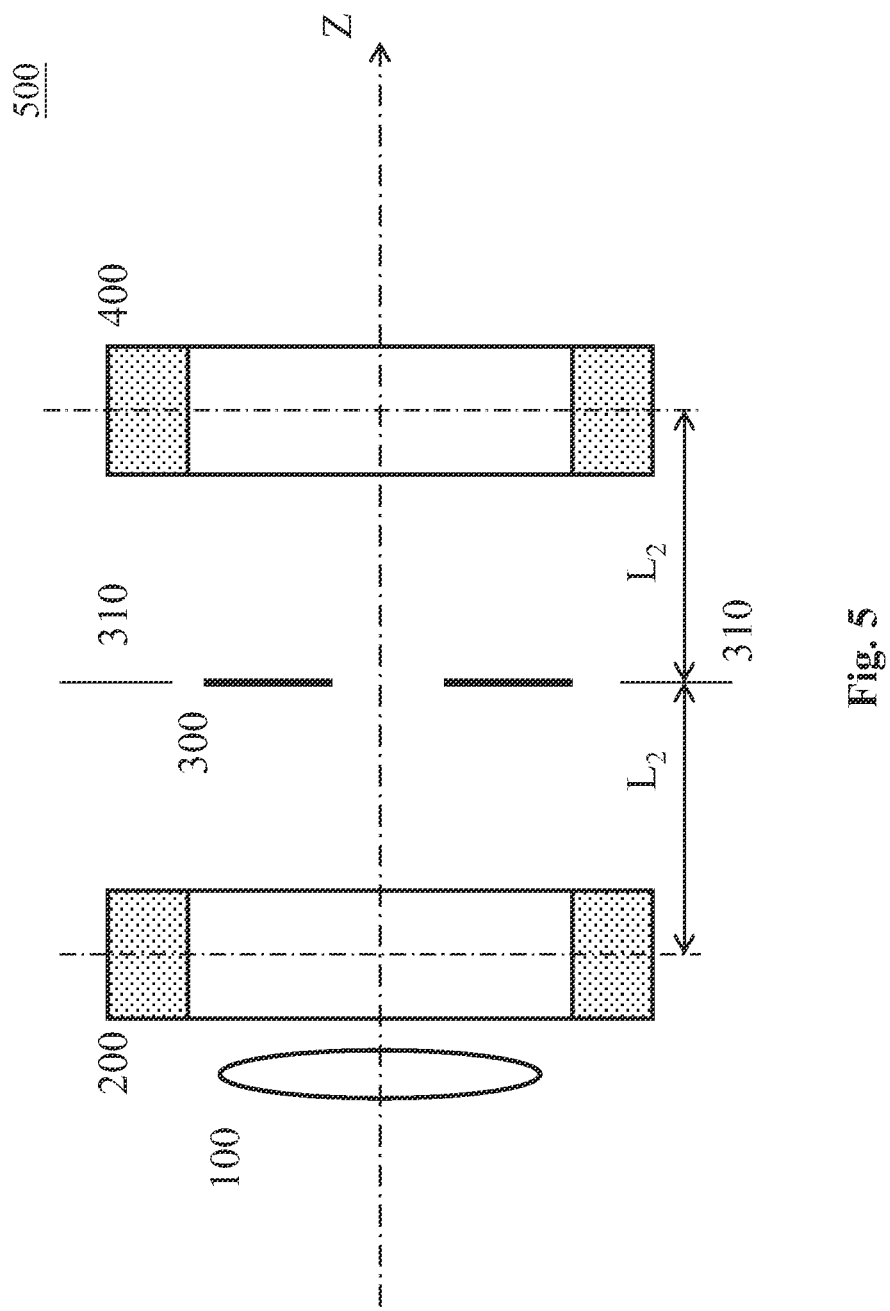
FIG. 5 shows a schematic representation of a monochromator for charged particle apparatus in accordance with a first embodiment of the present invention.

Consequently, from the entrance side to the exit side, the monochromator 500 of the present invention comprises a beam adjustment element (100), a first dispersion unit (200), an energy-limit aperture (300) and a second dispersion unit (400), as shown in FIG. 5. The two dispersion units have same structure and orientation, are exerted on same excitation, and are symmetrically located on each side of the energy-limit aperture (300). All the components are set and excited to ensure the double symmetry in deflection dispersion and fundamental trajectory with respect to the energy-limit aperture.

The monochromator of the present invention has a straight optical axis and the charged particles with normal energy thus are not diverted away from the optical axis. This characteristic not only makes the monochromator simple to be manufactured and adjusted, but also generates no off-axis aberrations which are actually impossible to be completely compensated. Moreover, instead of final formation of a real stigmatic crossover of the charged particle beam at the exit side of the monochromator, a virtual stigmatic and dispersion-free crossover of the charged particle beam is formed, which is located between the first dispersion unit and the energy-limit aperture. This virtual crossover will be the source for the following optics of an apparatus which requires the monochromator. On the one hand, the virtual crossover has less Boersch effect than a real crossover. On the other hand, the virtual crossover is located more close to the original charged particle source, and therefore will require less modification of the existing design of an electron microscope such as LVSEM than a real crossover when the monochromator is built into. According to all of the aspects mentioned above, the monochromator of the present invention provides an effective way to improve the imaging resolution of Low-Voltage SEM and the related apparatus which are based on LVSEM principle.

Figure 7A:
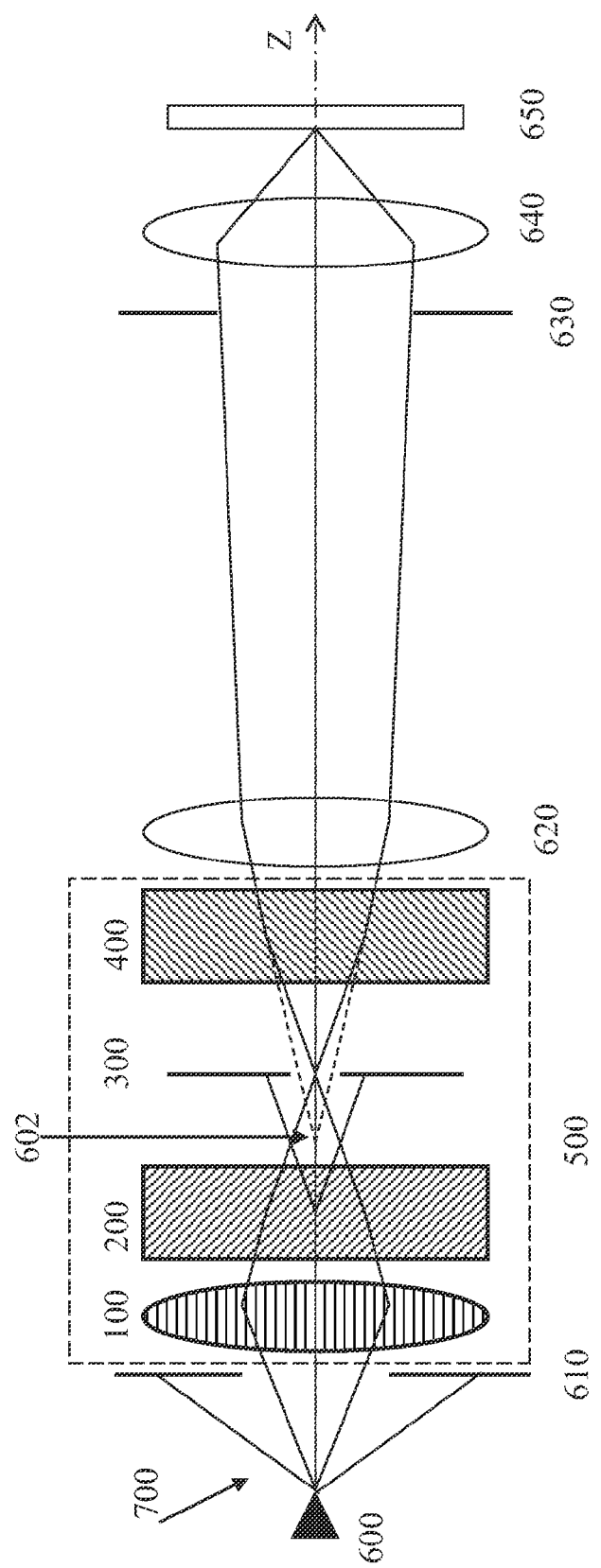
Figure 8:
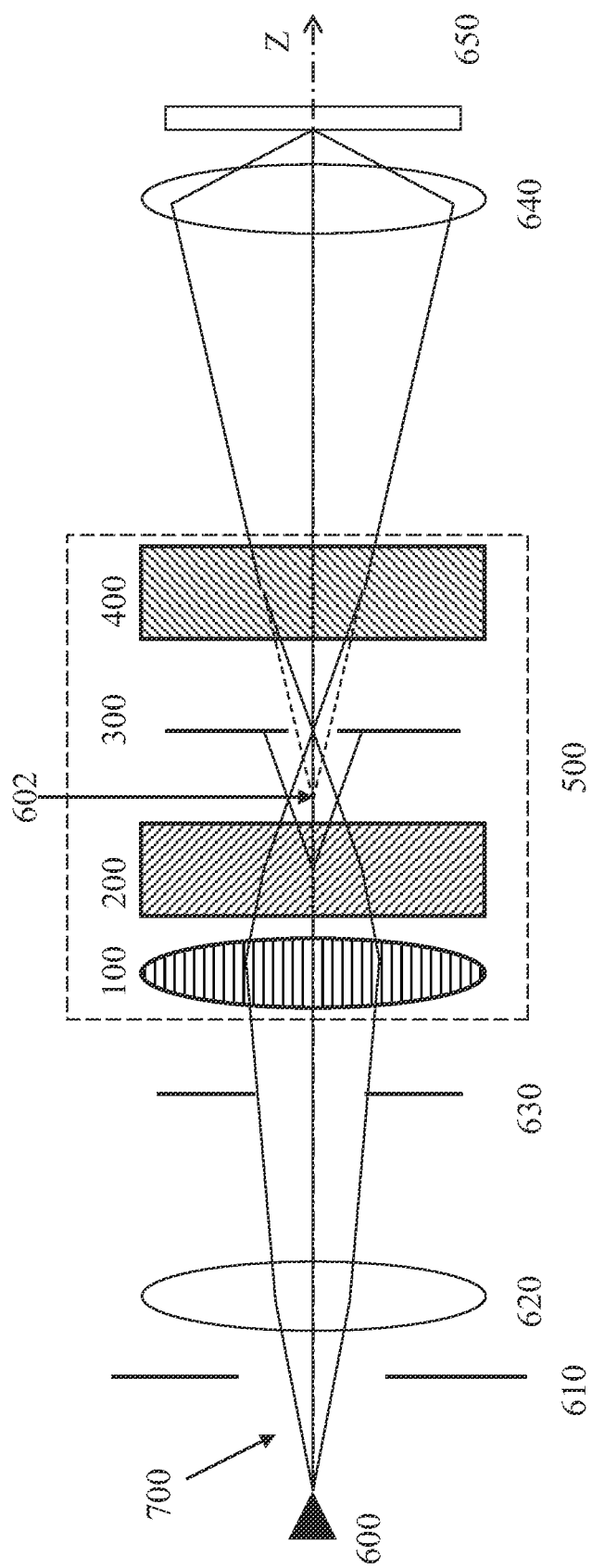
FIG. 8 shows a schematic representation of building a monochromator into a SEM in accordance with a third embodiment of the present invention.

This invention also provides two examples of using the monochromator of the present invention in an SEM. In the first example as shown in FIG. 7*a*, the monochromator is inserted between an electron source 600 and a condenser 620, and a current-limit aperture 610 is used to control the beam current going through the monochromator to reduce the electron interaction effect that occurs inside the monochromator. In the second example as shown in FIG. 8, the monochromator is located between a condenser and an objective lens, and the beam-limit aperture 630 controls the incident beam current of the monochromator.

Figure 9A:
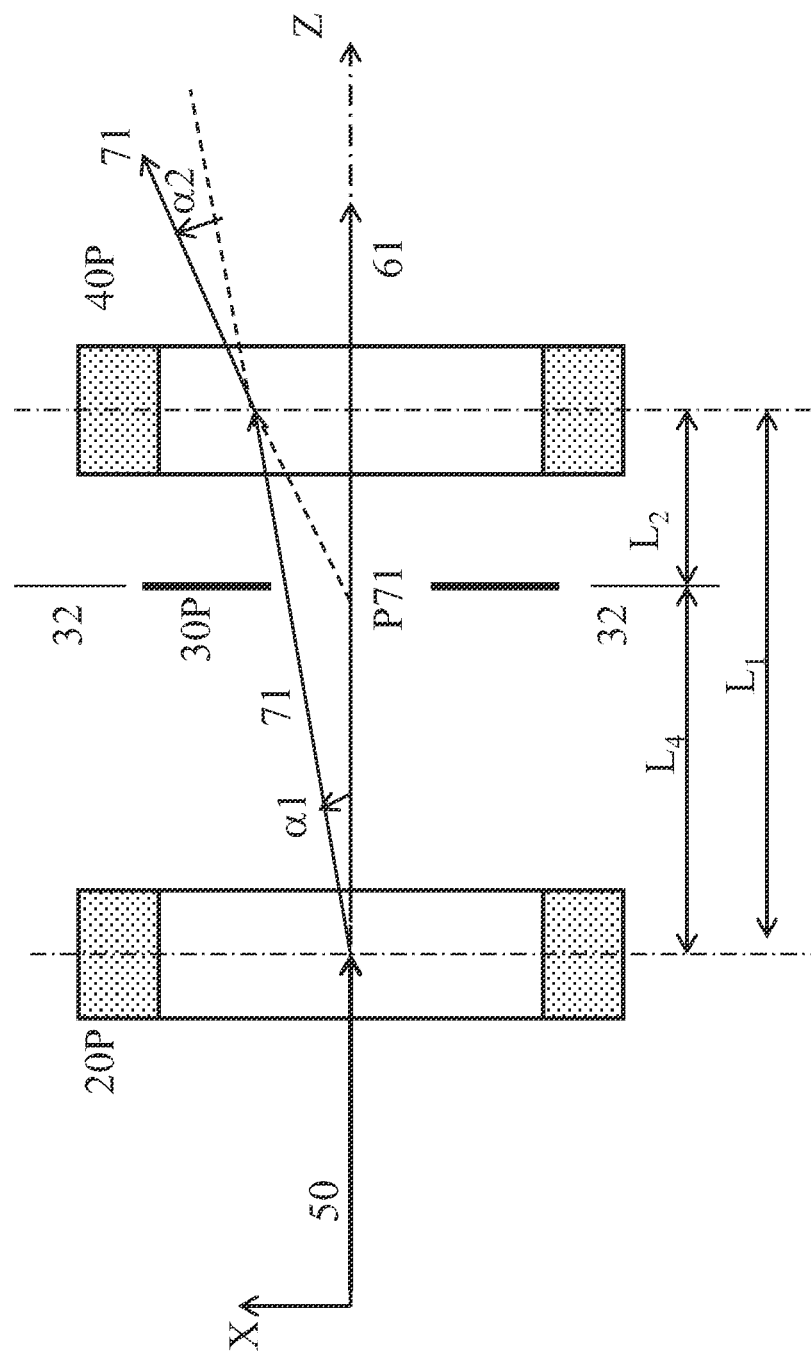
FIG. 9a and FIG. 9b show schematic representations of one dual proportional-symmetry of deflection dispersion and fundamental trajectory in accordance with the present invention.
Figure 9B:
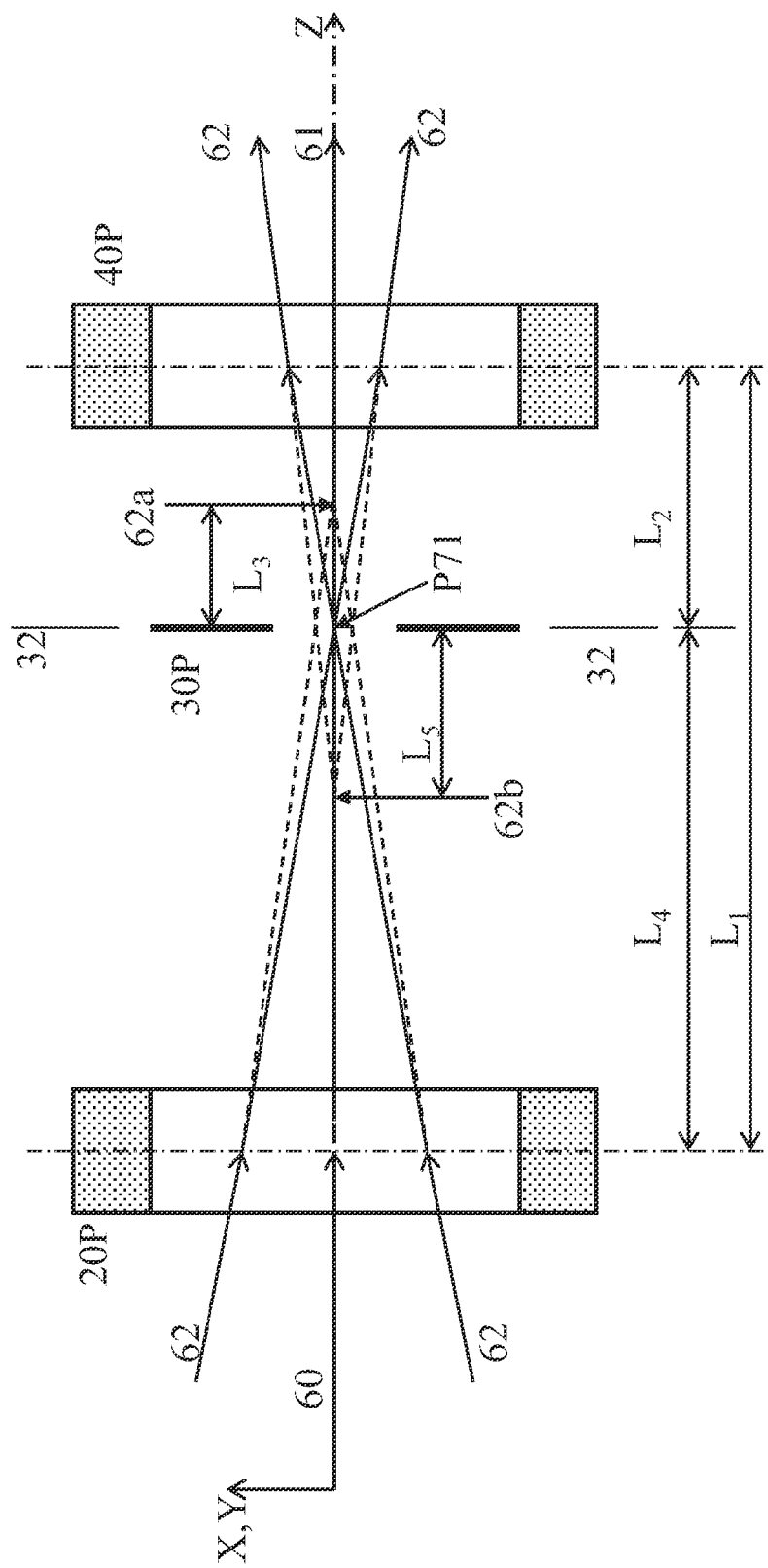

Thereafter the invention further provides a Wien filter type monochromator with a dual proportional-symmetry. Departing from the double symmetry shown in FIG. 4*a* and FIG. 4*b*, the dual proportional-symmetry provides a proportional relationship of deflection dispersion and fundamental trajectory along a straight optical axis with respect to the energy-limit aperture. Accordingly, the two dispersion units can be unequal but have a proportional relationship in dispersion power, and the energy-limit aperture therefore should be at a plane determined by the proportional relationship, wherein the plane may be not at the middle plane of the two dispersion units. The dual proportional-symmetry provides more flexibility of the monochromator in manufacturing and application. The dual proportional-symmetry is shown in FIG. 9*a* and FIG. 9*b*. Two monochromator embodiments with the dual proportional-symmetry are shown in FIG. 10 and FIG. 11.

Figure 12A:
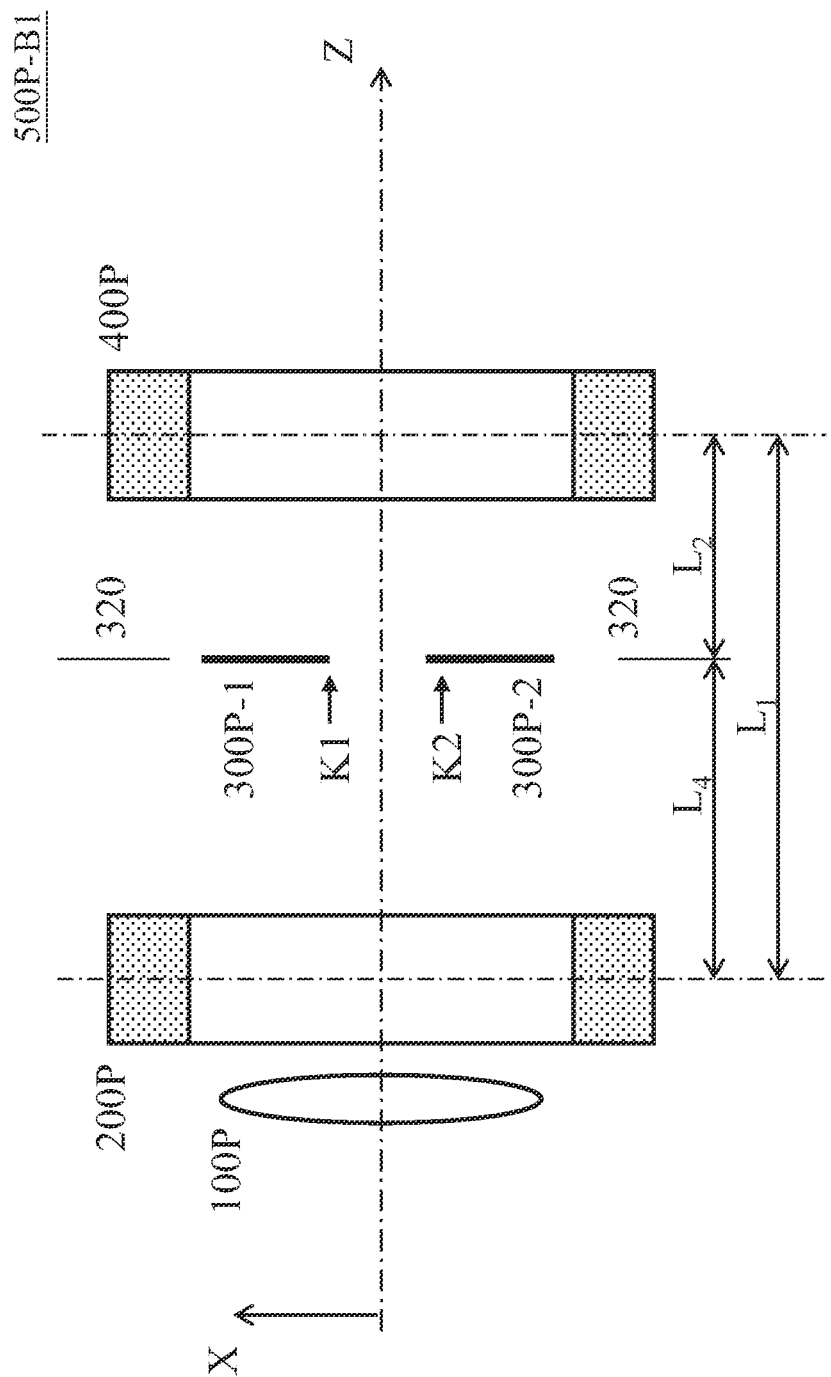
FIGS. 12a~12c show schematic representations of a monochromator for charged particle apparatus in accordance with a sixth embodiment of the present invention.
Figure 12B:
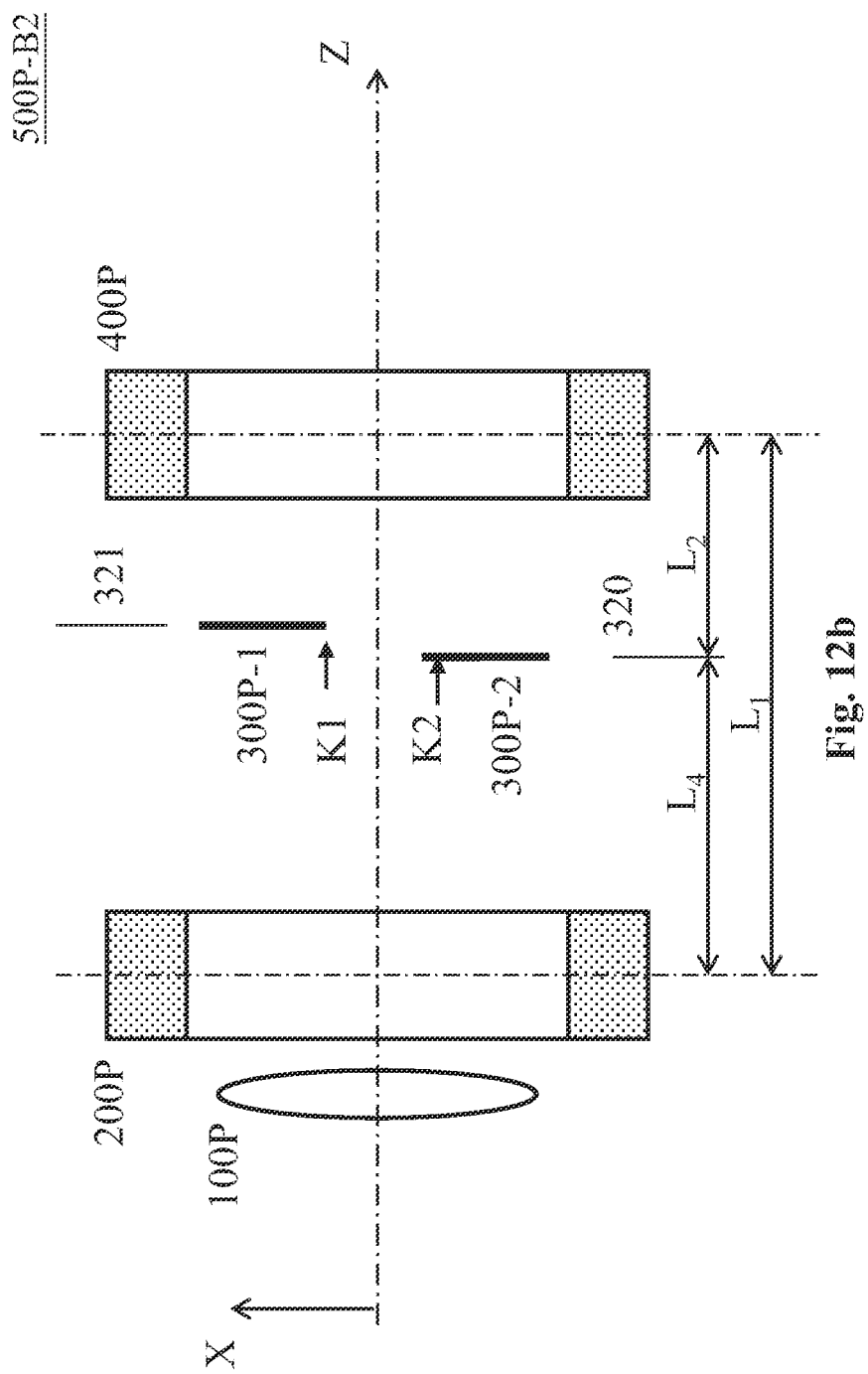
Figure 12C:
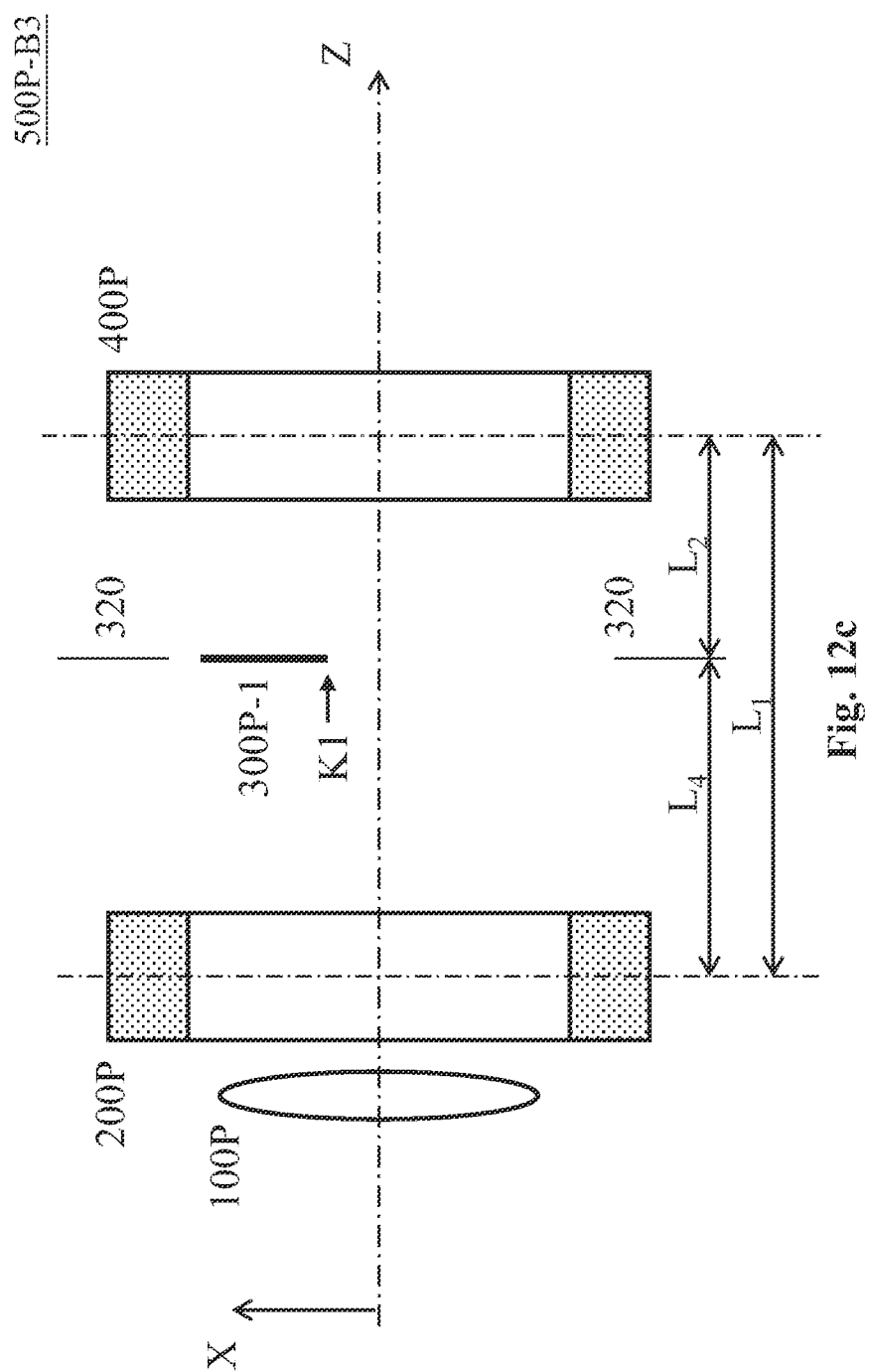

Afterward, for the foregoing monochromators with a double symmetry or a dual proportional-symmetry, the invention further provides a method to use a particle blockage of knife-edge type to cut off particles with lager energy deviations. In contrast to the foregoing energy-limit aperture which usually requires a tiny size in dispersion direction for getting a small energy spread, the particle blockage of knife-edge type is much simpler in manufacturing and even more practicable to get a smaller energy spread. FIGS. 12*a*~12*c* show three embodiments of the particle blockage of knife-edge type.

Detailed description and mechanism of this invention is described next.

The present invention provides a monochromator of Wien filter type for reducing energy spread of a primary electron beam in an SEM or charged particle apparatus. The monochromator forms a double symmetry for the incident beam in deflection dispersion and fundamental trajectory along a straight optical axis. The double symmetry ensures an incident charged particle beam coming from a charged particle source exits out of the monochromator with a reduced energy spread as well as keeping the effective crossover diameter and propagation direction unchanged.

The present invention also provides a way to build the monochromator into a SEM. The monochromator of the present invention helps to reduce chromatic aberration disc on a specimen by reducing energy spread of the primary beam or called as imaging beam, and meanwhile incurs no distinct increase in the source size. As a result, the probe spot size on specimen will achieve a lower value by re-balancing the blurs due to aberrations, diffraction and source size. Consequently, the monochromator provides an effective way to improve the imaging resolution of SEM especially LVSEM and the related apparatuses which are based on LVSEM principle, such as the defect inspection and defect review in semiconductor yield management.

The double symmetry, on which the monochromator provided in the present invention is based, comprises symmetry in deflection dispersion and anti-symmetry in fundamental trajectory, respectively with respect to the energy-limit aperture. In FIG. 4*a* which shows the symmetry in deflection dispersion, an on-axis electron beam 50 with a normal energy $V_0$ and an energy spread enters two dispersion units 20 and 40 successively along the optical axis Z. The two dispersion units 20 and 40 are same in configuration, and located and orientated symmetrically with respect to the plane 31 perpendicular to the optical axis Z. The position of each dispersion unit is defined by the center of the field region. Each dispersion unit comprises a Wien filter and a stigmator, and wherein magnetic and electrical fields of both are superposed to each other. Same excitation is exerted on each Wien filter to generate a desired deflection power which will not deflect the electrons with normal energy $V_0$ (such as 61), but deflect the electrons with energy deviation $\delta V$ from the normal energy $V_0$ (such as 71). As shown in the equation (1.6), the larger the energy deviation $\delta V$ is, the larger the deflection angle (such as $\alpha 1$ and $\alpha 2$) will be. The characteristic of deflection angle changing with energy deviation is called as deflection dispersion, and the ratio K of the deflection angle $\alpha$ and energy deviation $\delta V$ is called as dispersion power. The dispersion power changes with the normal energy $V_0$ and the magnetic dipole field which can be adjusted by change the electric excitation exerted on the Wien filter.

A plate is located on the plane 31, wherein an aperture 30 on the plate is aligned with the optical axis Z. In FIG. 4*a*, the deflection on the electron 71 with energy deviation $\delta V$ exists symmetrically with respect to the plane 31. The deflection angles $\alpha 1$ and $\alpha 2$ respectively generated by the two Wien filters in the first dispersion unit 20 and the second dispersion unit 40 are equal to each other, i.e. $\alpha 1 = \alpha 2$, and both are proportional to the energy deviation $\delta V$. The trajectory of 71 after exiting from the second dispersion unit 40 virtually crosses the optical axis at a distance $L_2$ backward from the center of the second dispersion unit 40, wherein $$L_2 = \frac{L_1}{2} \cdot \{1 - \tan^2(\alpha 1)\} \approx \frac{L_1}{2} \quad (2.1)$$

The distance $L_2$ does not change with deflection angle $\delta 1$ if all the items higher than $1^{st}$ order can be omitted. Hence, the first order dispersion of the exit beam disappears, and the incident on-axis beam becomes a divergent exit beam which seems being emitted from the geometric center point S71 of the two dispersion units.

The anti-symmetry in fundamental trajectory is based on the deflection dispersion symmetry. On the basis of what is shown in FIG. 4*a*, FIG. 4*b* shows the anti-symmetry in fundamental trajectory. In each dispersion unit (20 and 40) in FIG. 4*b*, the stigmator is excited to compensate the astigmatism which appears when the Wien filter acts to achieve the deflection dispersion symmetry shown in FIG. 4*a* and increases with an increase in the dispersion power of the Wien filter. Consequently each dispersion unit (20 and 40) has an equal focusing power f in both X and Y directions, which increases with an increase in the dispersion power of said each dispersion unit.

In FIG. 4*b*, anti-symmetry in fundamental trajectory can be achieved if an incident electron beam 62 with normal energy $V_0$, originally has a crossover at the specific position 62*a* on the optical axis. The crossover 62*a* is located at a distance L3 forward from the geometric center point S71 of the first and second dispersion units (20 and 40). If the distance L3 meets the following condition, $$L_3 = \frac{L_2^2}{f - L_2} \quad (2.2)$$

wherein f denotes the focusing power of the first dispersion unit, the first dispersion unit 20 will focus the incident electron beam 62 and accordingly moves its crossover from position 62*a* backward to the geometric center point S71. Then, in the same way the second dispersion unit 40 will focus the electron beam 62 and eventually move the crossover at S71 backward a distance L3 to position 62*b*. The trajectories of the electrons in the electron beam 62 with normal energy $V_0$ have anti-symmetry with respect to the geometric middle plane 31 of the first and second dispersion units 20 and 40.

Consequently, the double symmetry shown in FIG. 4*a* and FIG. 4*b* ensures an electron beam to form a dispersed real crossover at the middle plane 31 and a dispersion-free virtual crossover which is at first formed at the middle plane 31 and then moved backward a distance $L_3$. Inside the real crossover, the electrons with normal energy concentrate into a small disc on the optical axis, and the electrons with same energy deviation from the normal energy concentrate into a small disc located away from the optical axis. The larger the energy deviation is, the far the disc is away from the optical axis. If an aperture 30 is set up at the middle plane where the real crossover is located, the electrons inside all the discs which have off-axis distances larger than the inner radius of the aperture 30 will be cut off. In other words, the energy spread of the electrons passing through the aperture 30 will be smaller than a specific value which is determined by the dispersion power of the first dispersion unit and the inner diameter of the aperture 30. Inside the virtual crossover, all of the electrons concentrate into a small disc on the optical axis. Compared with the beam entrancing the first dispersion unit 20, the beam exiting from the second dispersion unit 40 has a smaller energy spread, a nearly unchanged crossover size, and a backward moving of the crossover.

FIG. 5 shows one monochromator embodiment of the present invention on the basis of the double symmetry shown in FIG. 4*a* and FIG. 4*b*. From the electron beam entrance side to the exit side, the monochromator 500 comprises a beam adjustment element 100, a first dispersion unit 200, an energy-limit aperture 300 and a second dispersion unit 400. All of the components (100~400) are aligned with and perpendicular to the optical axis Z. The two dispersion units 200 and 400 are same in configuration, and located and orientated symmetrically with respect to the plane 310 which is also perpendicular to optical axis Z. The energy-limit aperture 300 is located at the plane 310. Compared with FIG. 4*a* and FIG. 4*b*, in FIG. 5 the beam adjustment element 100 is added in order to ensure the double symmetry is retained whenever the incident electron beam is changed in crossover position and/or normal energy for some good reasons, and/or the dispersion power of the first dispersion unit 200 is changed for changing the energy spread of the electron beam after the monochromator. In other words the beam adjustment element enhances the applicability and flexibility of the monochromator.

In FIG. 5, the beam adjustment element 100 comprises a round lens which can be either electrostatic or magnetic. Each dispersion unit (200, 400) comprises a Wien filter and a stigmator which can be either electrostatic or magnetic, and both are superposed to each other along the optical axis Z. The shape of the energy-limit aperture 300 can be round, elliptic, square or rectangular. If the aperture shape is elliptic or rectangular, its shorter axis or shorter side is located in the dispersion direction of the first dispersion unit 200. The aperture size in dispersion direction is selected according to the desired energy spread reduction and the dispersion power of the first dispersion unit 200.

Figure 6A:
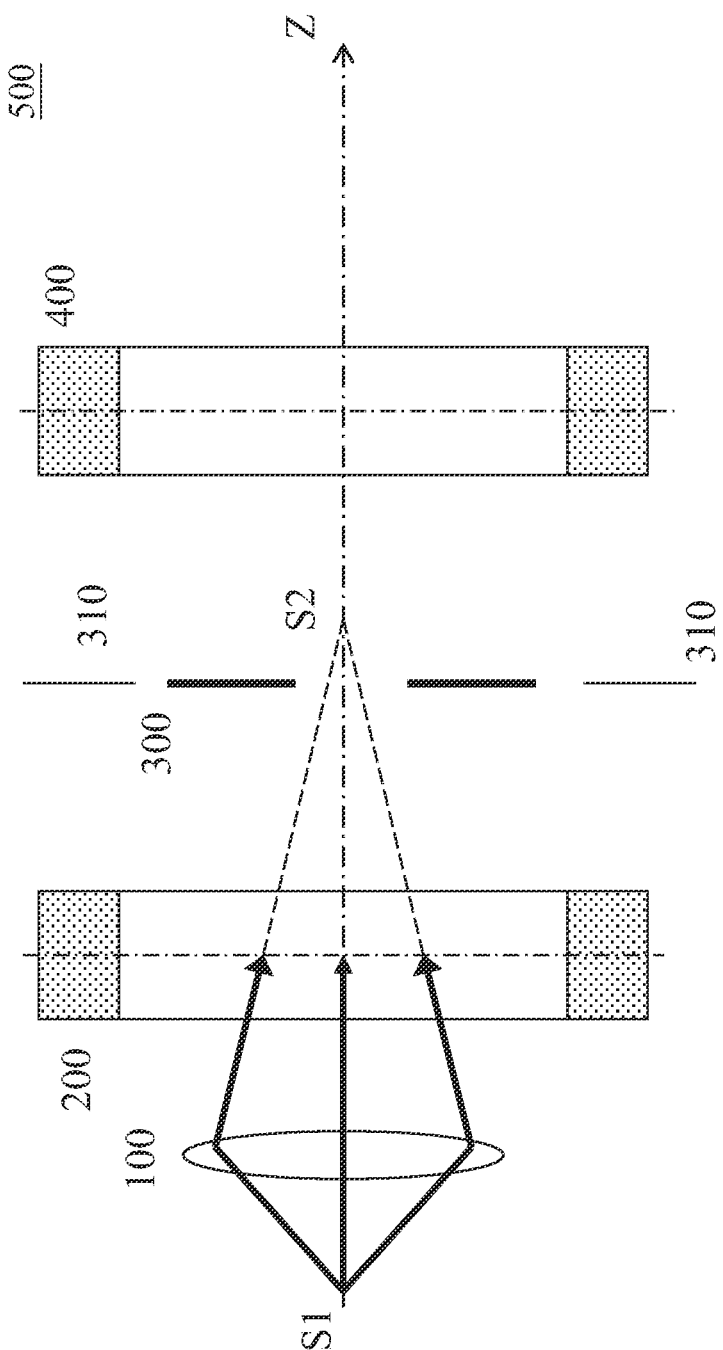

The operation method of the monochromator shown in FIG. 5 is expressed in FIGS. 6*a*~6*f* step by step. FIG. 6*a* shows the function of the beam adjustment element 100. S1 is an electron source or an electron beam crossover with normal energy $V_0$ and original energy spread $\pm \Delta V_0$, and whose energy spread is going to be reduced to $\pm \Delta V_1$. If S1 is an electron beam crossover, it may be located on the entrance or exit side of the monochromator. S2 is the position determined by the way shown in the equation (2.2), which is required for forming anti-symmetry in fundamental trajectory. Therefore, the beam adjustment element 100 at first focuses the electron beam from the source S1 to become a beam which is convergent at S2 before entering the first dispersion unit 200. More specifically, the focusing power of the beam adjustment element 100 is changed with a change in the initial position of incident electron beam crossover S1 and the focusing power f of the first dispersion unit 200. The latter one changes in accordance with the dispersion power of the first dispersion unit 200.

Figure 6B:
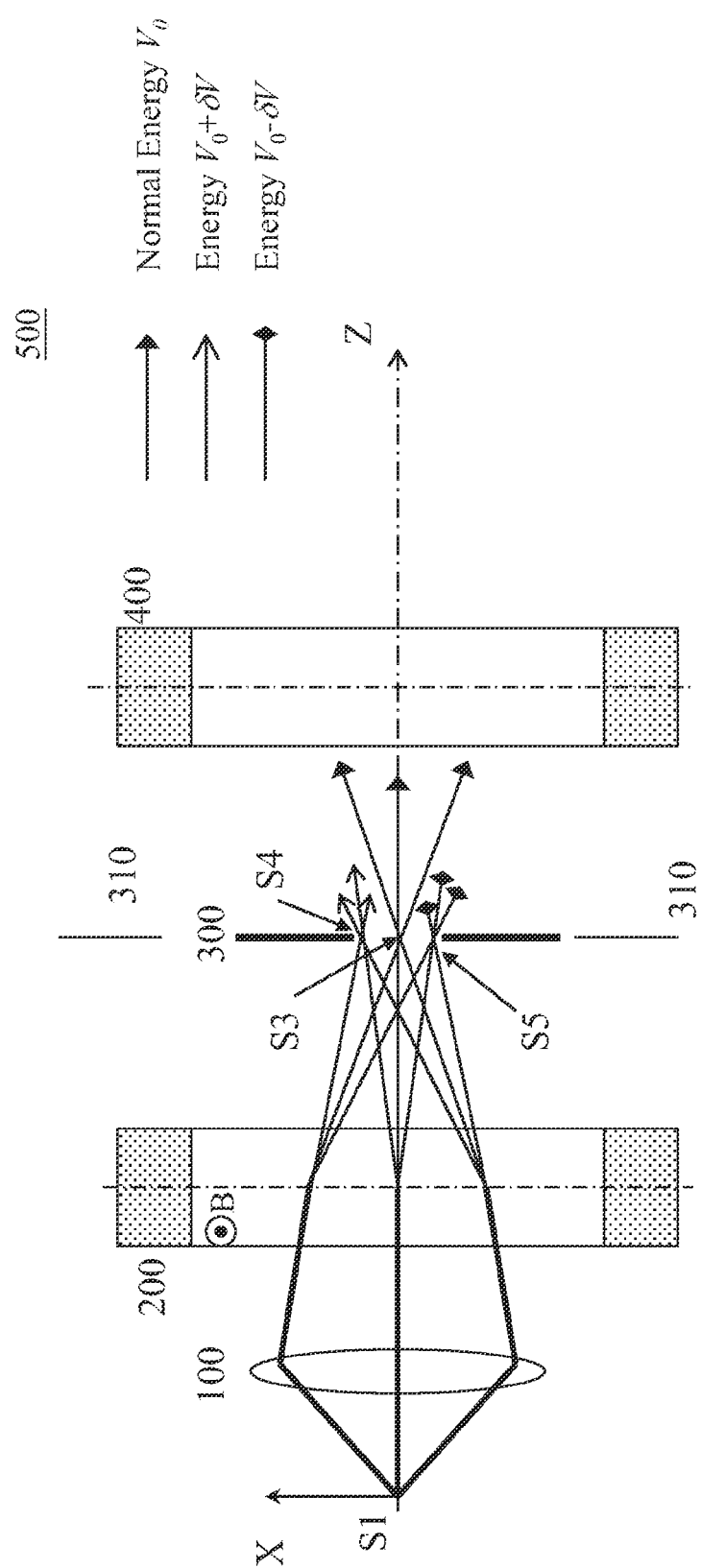

FIG. 6b and FIG. 6c show the effect of the first dispersion unit 200 on the incident beam in XOZ plane and YOZ plane respectively. The Wien filter in the first dispersion unit 200 is excited to meet Wien Condition and generate a desired X-direction deflection dispersion on the incident electron beam. The stigmator in the first dispersion unit 200 is excited to compensate the astigmatism generated by the Wien filter in the first dispersion unit 200. The residual stigmatic focusing power f after the astigmatism compensation focuses the incident beam to form a real crossover on the middle plane 310, which is backward from S2 in FIG. 6a. Due to the X-direction deflection dispersion of the Wien filter, only the electrons with normal energy concentrate into an on-axis disc S3. In accordance with the magnetic deflection direction, the discs S4 and S5 formed by the electrons with energy deviation $\delta V$ (>0) and $-\delta V$ are shifted away from the optical axis respectively in X and -X directions. The larger the energy deviation $\delta V$, the larger the off-axis shift will be. In Y direction, discs S3, S4, and S5 are all located on the optical axis as shown in FIG. 6c.

Figure 6D:
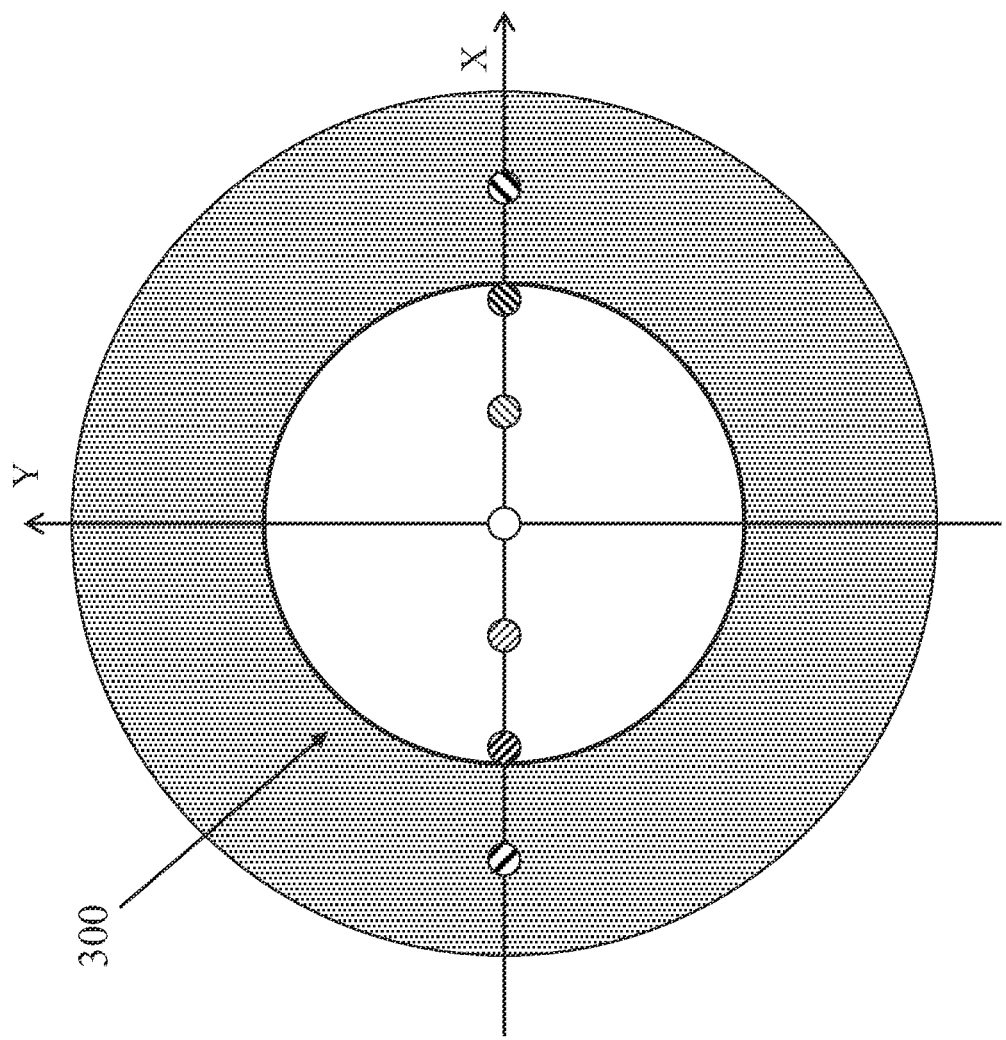

FIG. 6d shows the electron distribution on the energy-limit aperture 300. In FIG. 6d, only the electrons with the normal energy $V_0$ and six specific energy deviations are shown, and a round shape aperture 300 is taken as an example. The inner radius of the energy-limit aperture 300 is equal to the off-axis shift of the electrons with energy deviation $\pm \Delta V_1$, so the energy-limit aperture 300 cuts off electrons outside the inner hole, i.e. a spatial area of the real crossover. In this way, the electron beam exits from the aperture 300 with a reduced energy deviations $\pm \Delta V_1$ but an enlarged crossover whose size in X direction is equal to the inner diameter of the energy-limit aperture 300. The reduced energy deviations $\pm \Delta V_1$ is determined by the dispersion power of the first dispersion unit and the size of the energy-limit aperture in the dispersion direction of the first dispersion unit.

Figure 6E:
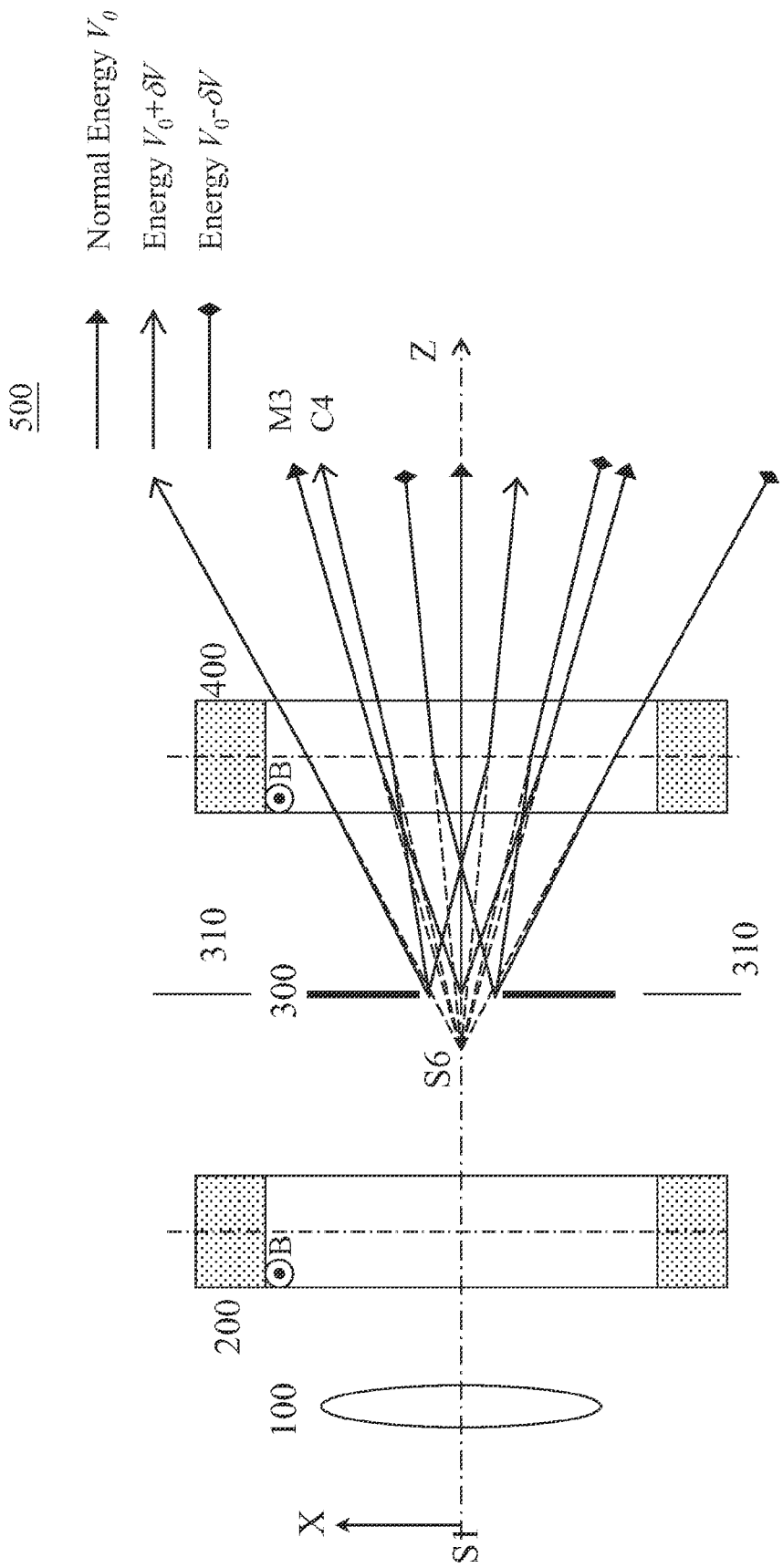
Figure 6F:
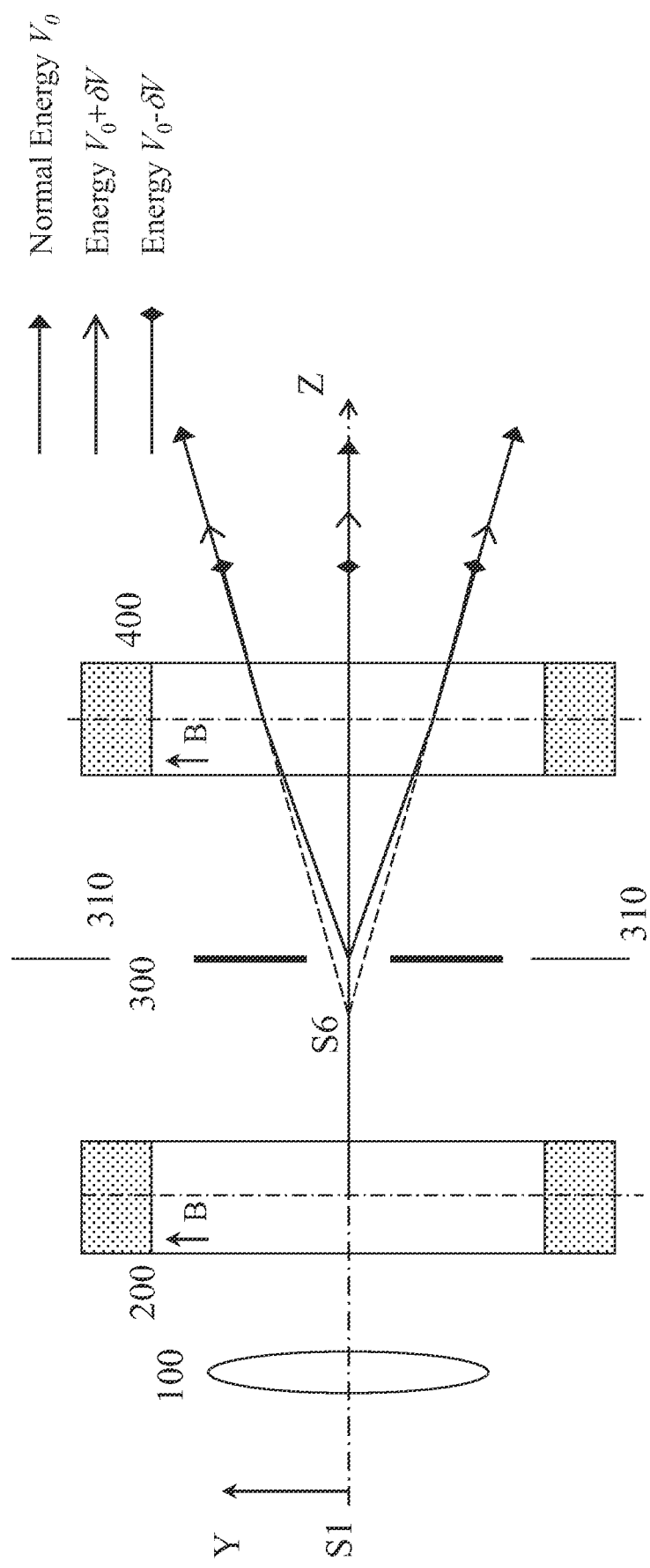

FIG. 6e and FIG. 6f show the effect of the second dispersion unit 400 on the incident beam. The second dispersion unit 400 is exerted on the same excitations as the first dispersion unit 200. Therefore, the second dispersion unit 400 deflects and focuses the electron beam coming from the real crossover in the middle plane 310 in the same way as the first dispersion unit 200 did on the electron beam in front of the aperture 300. In XOZ plane as shown in FIG. 6e, the second dispersion unit 400 not only moves discs S3~S5 backward a same distance from the middle plane 310, but also eliminates the X-direction disc shift which exists in the real crossover. In YOZ plane as shown in FIG. 6f, the second dispersion unit 400 moves discs S3~S5 backward the same distance as in XOZ. Consequently, after exiting from the second dispersion unit 400, the electrons from the three discs S3~S5 shown in FIG. 6b and FIG. 6c virtually almost cross at the same place on the optical axis Z, and form a virtual crossover S6. The virtual crossover S6 is located between the first dispersion unit 200 and the middle plane 310, and has a size much smaller than the inner diameter of the energy-limit aperture 300 as shown in FIG. 6d or the size of the energy-limit aperture 300 in dispersion direction without loss of generality.

FIG. 7a and FIG. 8 respectively demonstrate two embodiments of a SEM using a monochromator described above and shown in FIG. 5 and FIGS. 6a~6f. For sake of simplicity, deflection scanning is not shown. In FIG. 7a, an electron source 600 emits an electron beam 700 along the optical axis Z. A first current-limit aperture 610 cut off a certain part of the electron beam 700, so as to limit the current of the electron beam entering the monochromator 500. A larger beam current in the monochromator 500 will generate a strong electron interaction in the focusing range of the electron beam, especially in the real crossover located at the center area of the energy-limit aperture 300, so an additional energy spread and a crossover size increase occur in the monochromator. Therefore, the beam current must be limited to such an extent that the effect of the electron interaction is not noticeable.

In the monochromator 500 of FIG. 7a, at first the electron beam is focused to become a desired convergent beam by the beam adjustment element 100. Then the convergent beam is dispersed and focused by the first dispersion unit 200. Concretely speaking, the electrons with a normal energy pass essentially straight through and form a stigmatic real crossover on the optical axis and at the center of the energy-limit aperture 300, and the electrons having same energy deviation with respect to the normal are deflected and form a stigmatic real crossover away from the optical axis but on the plane where the energy-limit aperture 300 is located. The larger the energy deviation of the electrons is, the far the crossover is away from the optical axis. The energy-limit aperture 300 then cuts off the electrons with energy deviations out of a desired range $\pm \Delta V_1$, so that the exit electron beam has a reduced energy spread $\pm \Delta V_1$.

Subsequently in the monochromator 500 of FIG. 7a, the electrons exiting from the energy-limit aperture 300 will enter the second dispersion unit 400. The second dispersion unit 400 works in the same way as the first dispersion unit 200. Therefore it deflects the electrons from each real crossover on the energy-limit aperture 300 away from the optical axis with the same angle and focuses the electrons to form a virtual crossover at a position backward the same on-axis distance from the last corresponding real crossover as the first dispersion unit 200 did. However, this time all the virtual crossovers are virtually located at the same place on the optical axis. Consequently, all the electrons exiting from the monochromator look like emitting from the virtual source 602 and have energy deviations within the desired range $\pm \Delta V_1$.

In FIG. 7a, the electron beam exiting from the monochromator 500 will then enter the following the imaging system of a conventional SEM, and is focused onto the surface of the specimen 650 by the condenser 620 and the objective lens 640. The condenser and the beam-limit aperture 630 together control the final probe current. Actually, the beam-limit aperture 630 has an additional effect same as the energy-angle depending filtering, as shown in FIG. 7b. Although all the electrons exiting from the monochromator 500 virtually cross at the same place 602 on the optical axis, but the electrons with energy deviations accumulate the deflection angles generated by the first and second dispersion units 200 and 400. Therefore, the electrons with same energy deviation have an equal additional transverse shift on the beam-limit aperture 630, and some with larger polar angles will be blocked by the beam-limit aperture 630, such as the shadow parts in FIG. 7b. The larger the energy deviation is, the more the electrons will not pass the beam-limit aperture 630, so the beam-limit aperture 630 actually further reduces the effective energy spread of the electron beam entering the following objective lens 640 which finally focuses the electron beam on the specimen 650. Thus the chromatic aberration in the probe spot will be reduced and the probe spot size will be smaller than the one without using the monochromator.

Figure 7C:
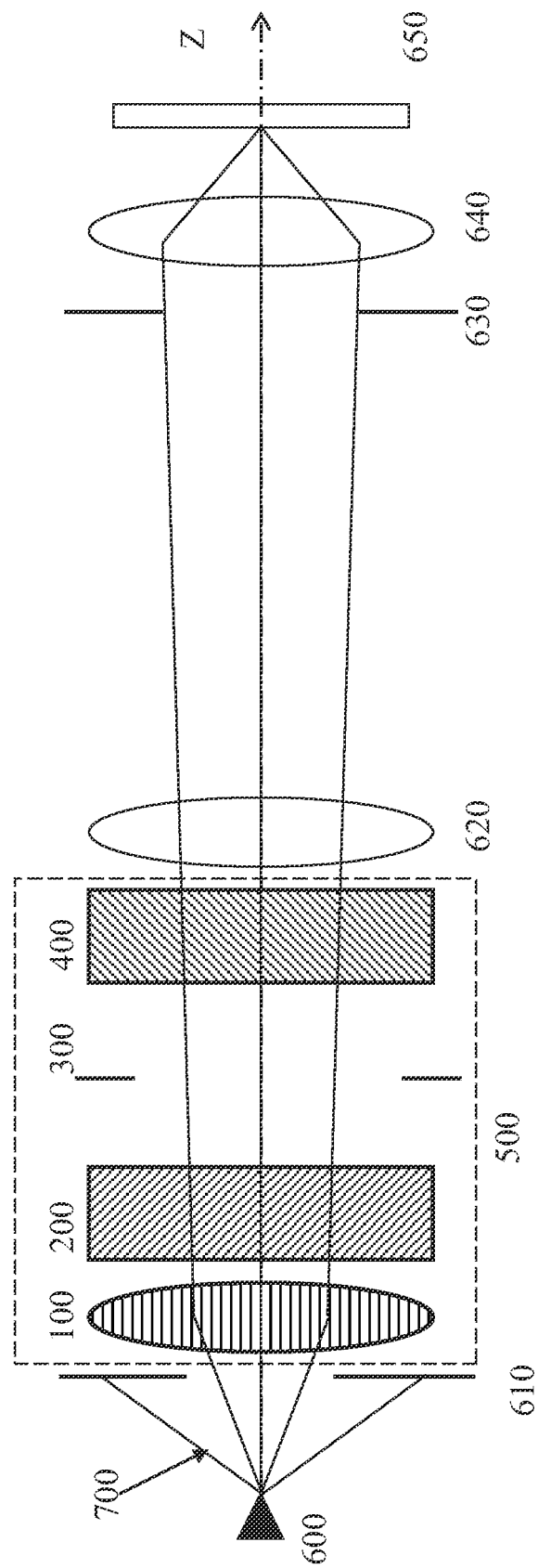

As it is well known, using a monochromator to improve the imaging resolution will sacrifice a part of probe current because the electrons with energy deviations larger than the limit value are cut off. For the applications which need large probe current, the monochromator 500 can be disabled except the beam adjustment element 100, as shown in FIG. 7c. In this case, the beam adjustment element 100 replaces the original condenser 620 to act as a condenser. Usually a condenser closer to the electron source and further away from the beam-limit aperture generates smaller aberrations than a counter.

FIG. 8 shows another embodiment of a SEM using a monochromator, where the SEM originally has a real crossover 602 located at a fixed position in front of the objective lens 640. In FIG. 8, the electron source 600 emits an electron beam 700 along the optical axis Z. The condenser 620 and the beam-limit aperture 630 control the current of the beam entering the monochromator. Subsequently in the Monochromator 500, the electron beam will experience the same energy filtering as being described in FIG. 7a. The exit beam from the monochromator 500 has a virtual crossover 602 and a reduced energy spread. For the applications which need large probe current, the monochromator 500 can be disabled except the beam adjustment element 100. In this case, the beam adjustment element 100 focuses the electron beam to have a real crossover 620 at the same place. Then the objective lens 640 will focus the electron beam on the surface of the specimen 650. Thus the chromatic aberration in the probe spot will be reduced and the probe spot size will be smaller than the one without using the monochromator.

Returning to FIG. 4a, if the deflection angles α1 and α2 of the two dispersion units 20 and 40 are not equal to each other but has a proportional relationship which is expressed in equation (2.3), the distance $L_2$ will change with the proportional relationship as shown in equation (2.4). Similarly to the equation (2.1), the distance $L_2$ does not change with deflection angle α1 if all the items higher than $1^{st}$ order can be omitted. In this case the first order dispersion of the exit beam disappears and the dispersion powers of the two dispersion units simply have a proportional relationship shown in equation (2.5). Therefore two dispersion units with the proportional relationship in dispersion power can also realize an energy filtering with a dispersion-free crossover.

$$\tan(\alpha 2) = k \cdot \tan(\alpha 1) \qquad (2.3)$$

$$L_2 = \frac{L_1}{1+k} \cdot \{1 - k \cdot \tan^2(\alpha 1)\} \approx \frac{L_1}{1+k} \qquad (2.4)$$

$$K_2 = k \cdot K_1 \qquad (2.5)$$

FIG. 9a and FIG. 9b show the dispersion compensation and fundamental trajectories in this situation. In FIG. 9a, two dispersion units 20P and 40P and an energy-limit aperture 30P are aligned with an optical axis Z. An on-axis electron beam 50 moves along the optical axis Z and goes through the first dispersion unit 20P, the energy-limit aperture 30P and the second dispersion unit 40P successively. For an electron 71 with an energy deviation from the normal energy of the beam 50, the dispersion powers of the two dispersion units 20P and 40P are set to make two deflection angles (α1 and α2) have a ratio k as shown in the equation (2.3). The trajectory of 71 after exiting from the second dispersion unit 40P virtually crosses the optical axis with the distance $L_2$ backward from the center of the second dispersion unit 40P and the distance $L_2$ depends on the ratio k as shown in the equation (2.4). The crossing point P71 divides the interval $L_1$ between the two dispersion units into two intervals $L_4$ and $L_2$. According to equation (2.4), the ratio of the intervals L4 and L2 is also equal to the ratio k. The plane 32 is perpendicular to the optical axis Z and comprises the crossing point P71. The energy-limit aperture 30P is located at the plane 32. Therefore the two dispersion units form a proportional-symmetry of dispersion with respect to the plane 32 or the energy-limit aperture 30P.

$$\frac{L_4}{L_2} = k \qquad (2.6)$$

Each of the dispersion units 20P and 40P can only have a Wien filter or have a Wien filter and a stigmator which compensates the astigmatism of the Wien filter. On the basis of the dispersion compensation shown in FIG. 9a, FIG. 9b shows the fundamental trajectories when each dispersion unit has a Wien filter and a stigmator. As mentioned above each dispersion unit consequently has an equal focusing power in both X and Y directions, which increases with an increase in the dispersion power thereof. In FIG. 9b, the electron beam 62 with normal energy $V_0$ originally has a crossover at the specific position 62a which is on the optical axis and between the point P71 and the second dispersion unit 40P. If the distance $L_3$ between the point P71 and the crossover 62a meets the following condition, $$L_3 = \frac{L_4^2}{f_1 - L_4} \qquad (2.7)$$

wherein $f_1$ denotes the focusing power of the first dispersion unit 20P, the first dispersion unit 20P will focus the incident electron beam 62 and accordingly moves its crossover from position 62a backward to the point P71, i.e. to the center of the energy-limit aperture 30P. Then, the second dispersion unit 40P will focus the electron beam 62 and eventually move the crossover at P71 backward a distance $L_5$ to the position 62b. The distance $L_5$ changes with the focusing power $f_2$ of the second dispersion unit 40P, as shown in equation (2.8). Within the intervals $L_4$ and $L_2$ both being proportionally related, the trajectories of the electrons in the electron beam 62 have anti-symmetry with respect to the energy-limit aperture 30P.

$$L_5 = \frac{L_2^2}{f_2 - L_2} \qquad (2.8)$$

Therefore the two dispersion units 20P and 40P form a dual proportional-symmetry of dispersion and fundamental trajectory in FIG. 9a and FIG. 9b, which ensures an electron beam form a dispersed real crossover at the plane 32 and a dispersion-free virtual crossover which is at first formed at the plane 32 and then moved backward a distance $L_5$. Compared with the double symmetry in FIG. 4a and FIG. 4b, the dual proportional-symmetry provides more possibilities to realize an energy filtering with a dispersion-free crossover.

FIG. 10 shows one monochromator embodiment of the present invention on the basis of the dual proportional-symmetry shown in FIG. 9a and FIG. 9b. From the electron beam entrance side to the exit side, the monochromator 500P comprises a beam adjustment element 100P, a first dispersion unit 200P, an energy-limit aperture 300P and a second dispersion unit 400P. All of the components (100P~400P) are aligned with and perpendicular to an optical axis Z. The dispersion powers of the two dispersion units 200P and 400P are set to have a ratio k and the energy-limit aperture 300P is located at the plane 320. The plane 320 divides the interval $L_1$ between the two dispersion units 200P and 400P into two parts $L_4$ and $L_2$ by the ratio k. Compared with FIG. 9a and FIG. 9b, the beam adjustment element 100P is added to ensure the dual proportional-symmetry is retained whenever an incident electron beam is changed in crossover position and/or normal energy for some good reasons, and/or the dispersion power of the first dispersion unit 200P is changed for changing the energy spread of the electron beam after the monochromator. In other words the beam adjustment element enhances the applicability and flexibility of the monochromator.

In FIG. 10, the beam adjustment element 100P comprises a round lens which can be either electrostatic or magnetic. Each of the two dispersion units 200P and 400P can only comprise a Wien filter or comprise a Wien filter and a stigmator which can be either electrostatic or magnetic. The shape of the energy-limit aperture 300P can be round, elliptic, square or rectangular. The aperture size of the energy-limit aperture 300P in dispersion direction is selected according to the desired energy spread reduction and the dispersion power of the first dispersion unit 200P.

FIG. 11 shows another monochromator embodiment 510P of the present invention in terms of a variation of the dual proportional-symmetry shown in FIG. 9a and FIG. 9b. From the electron beam entrance side to the exit side, the monochromator 510P comprises a first dispersion unit 210P, a beam adjustment element 110P, an energy-limit aperture 310P and a second dispersion unit 410P. All of the components (110P~410P) are aligned with and perpendicular to an optical axis Z. The energy-limit aperture 310P is located at the plane 330 which divides the interval $L_1$ between the two dispersion units 210P and 410P into two parts $L_4$ and $L_2$, wherein the ratio of $L_4$ and $L_2$ may be not equal to 1. The dispersion power of the first dispersion unit 210P and the focusing power of the beam adjustment element 110P are set to get both a desired dispersion and a real crossover of an incident beam at the plane 330 or the energy-limit aperture 310P, while the dispersion power of the second dispersion unit 410P is set to form a dispersion-free virtual crossover of the incident beam at the plane 330.

Same as the monochromator 500, the monochromators 500P and 510P can be employed in a SEM by the ways as shown in FIG. 7a and FIG. 8. In addition, the monochromators 500P and 510P provide more flexibility in manufacturing and application. For the Monochromator 500P, if there is an application which requires the virtual crossover 602 (in FIG. 7a and FIG. 8) of the exit beam much close to the electron source 600, the ratio k of the two dispersion powers can be set to be smaller than 1. If there is a desired energy spread reduction which requires the energy-limit aperture 300P to have a small size difficult in manufacturing, using a large value of the ratio k can move the energy-limit aperture 300P close to the second dispersion unit 400P so that the required size of the energy-limit aperture 300P can be increased.

Returning to FIG. 4a again (or FIG. 9a), a desired value of energy spread reduction may require the energy-limit aperture 30 (or 30P) to have a tiny dimension in the dispersion direction (which is in X direction), which may be very difficult in manufacturing. In this case, the energy-limit aperture can be formed by two plates each having a knife-edge. The two knife-edges of the two plates are opposite to each other in the dispersion direction to form a slim slit aligned with the optical axis. By preciously adjusting the position of each knife-edge in the dispersion direction, the dimension of the slit can be changed to be very small. For a specific application which only requires cutting the electrons with energies higher or lower than a specific value, similar to high-pass filtering or low-pass filtering, the electron blockage can be done by using only one knife-edge.

Taking the monochromator 500P in FIG. 10 as an example, FIGS. 12a~12c show three embodiments of the electron blockage. In FIG. 12a, the monochromator 500P-B1 comprises two plates 300P-1 and 300P-2, wherein the two knife-edges K1 and K2 of the two plates are on the same plane 320 and opposite to each other in X direction (which is the dispersion direction) to form a slim slit covering the optical axis Z. To prevent the possibility of the two knife-edges colliding during adjusting the slit size, the knife-edges K1 and K2 can be set on two different planes. In contrast to FIG. 12a, the knife-edges K1 in FIG. 12b is on the plane 321 closer to the second dispersion unit 400P than the plane 320. In FIG. 12c only one knife-edge is used to block the electrons with energies higher than a specific value or with energies lower than a specific value. Without loss of generality, all the foregoing methods (such as using energy-limit aperture or knife-edge) and the corresponding embodiments thereof for blocking electrons are indicated by particle-blockage means and particle-blockage unit in general respectively.

In this invention, a monochromator for reducing energy spread of a primary electron beam in a SEM is provided, which is used to reduce the imaging chromatic aberration so as to improve the ultimate imaging resolution of a SEM especially a Low-Voltage SEM and the related apparatuses which are based on LVSEM principle. The monochromator uses Wien filter as dispersion element to realize an energy depending filtering along a straight optical axis, which fundamentally avoids incurring off-axis aberrations that actually cannot be compensated. In the monochromator a dual proportional-symmetry is formed, which comprises a proportional relationship in deflection dispersion and fundamental trajectory with respect to a plane inside a particle-blockage unit. The dual proportional-symmetry and the particle-blockage unit realize energy depending filtering (high-pass, low-pass and band-pass), and at the same time ensures the exit charged particle beam has a virtual crossover which is inside the monochromator and free of the first-order dispersion and astigmatism. Compared with a real crossover on the exit side of the monochromator in the prior art, a virtual crossover inside the monochromator incurs less electron interaction and requires less modification of the original design of a SEM. Moreover, the monochromator of the present invention has a broader applicability and a stronger flexibility when being used in an apparatus than the prior art. The present invention also provides two ways to build a monochromator into a SEM; one is to locate a monochromator between the electron source and the condenser, and the other is to locate a monochromator between the beam-limit aperture and the objective. The former provides an additional energy-angle depending filtering, and obtains a smaller effective energy spread than the latter.

Although specific embodiments of the present invention have been described, it will be understood by those of ordinary skill in the art that there are other embodiments that are equivalent to the described embodiments. Accordingly, it is to be understood that the invention is not to be limited by the specific illustrated embodiments, but only by the scope of the appended claims.

What is claimed is:

1. A monochromator, comprising:
a first dispersion unit and a second dispersion unit both aligned with a straight optical axis of the monochromator and configured to in sequence deflect a charged particle beam with a normal energy and an energy spread, the charged particle beam propagating along the optical axis and including charged particles with the normal energy passing straight through each dispersion unit and charged particles with energy deviations from the normal energy being deflected by said each dispersion unit in a same direction as a dispersion direction thereof, wherein a deflection angle of each charged particle generated by said each dispersion unit depends on a dispersion power thereof and energy deviation of said each charged particle, and wherein the dispersion directions of the first and second dispersion units are same;
a particle-blockage unit between the first and second dispersion units; and
a beam adjustment element aligned with the straight optical axis and configured to focus the charged particle beam to form a real crossover at a plane inside the particle-blockage unit,
wherein inside the real crossover, each particle with energy deviation has a position shift due to said deflection angle generated by the first dispersion unit,
wherein the particle-blockage unit cuts off particles located outside a spatial area of the real crossover,
wherein a virtual crossover is formed inside the monochromator after the charged particle beam is dispersed by the second dispersion unit.

2. The monochromator of claim 1, wherein the dispersion powers of said two dispersion units have a proportional relationship so as to make the virtual crossover free of first-order dispersion and at or close to the plane.

3. The monochromator of claim 2, wherein the beam adjustment element is on a beam entrance side of the first dispersion unit.

4. The monochromator of claim 3, wherein the first dispersion unit comprises a first Wien filter and a first stigmator which compensates astigmatism generated by the first Wien filter, and the second dispersion unit comprises a second Wien filter and a second stigmator which compensates astigmatism generated by the second Wien filter.

5. The monochromator of claim 4, wherein the beam adjustment element is a round lens.

6. The monochromator of claim 5, wherein an exit energy spread of the charged particle beam after exiting from the monochromator can be changed by simultaneously changing the dispersion powers of the first and second dispersion units in terms of the proportional relationship and a focusing power of the beam adjustment element.

7. The monochromator of claim 2, wherein the particle-blockage unit uses an energy-limit aperture to cut off particles.

8. The monochromator of claim 7, wherein the particle-blockage unit has multiple energy-limit apertures with different aperture sizes in the dispersion direction of the first dispersion unit so that an exit energy spread of the charged particle beam after exiting from the monochromator can be changed by using a different energy-limit aperture.

9. The monochromator of claim 2, wherein the particle-blockage unit uses a first knife-edge to cut off particles.

10. The monochromator of claim 9, wherein an exit energy spread of the charged particle beam after exiting from the monochromator can be changed by adjusting a position of said first knife-edge in the dispersion direction of the first dispersion unit.

11. The monochromator of claim 9, wherein the particle-blockage unit further uses a second knife-edge to cut off particles.

12. The monochromator of claim 11, wherein an exit energy spread of the charged particle beam after exiting from the monochromator can be changed by adjusting one or both of positions of said two knife-edges in the dispersion direction of the first dispersion unit.

13. The monochromator of claim 2, wherein the beam adjustment element is between the first dispersion unit and the particle-blockage unit.

14. A charged particle beam apparatus, comprising:
a charged particle source adapted to provide a primary charged particle beam propagating along a straight optical axis of the apparatus;
a condenser aligned with the optical axis and constructed to focus the primary charged particle beam;
an objective lens aligned with the optical axis and able to focus the primary charged particle beam onto a surface of a specimen which emanates secondary charged particles;
a detector configured to receive the secondary charged particles; and
a monochromator according to claim 1, wherein the monochromator is aligned with the optical axis and disposed between the charged particle source and the objective lens to reduce an energy spread of the primary charged particle beam.

15. The charged particle beam apparatus of claim 14, wherein the dispersion powers of the two dispersion units of the monochromator have a proportional relationship so that the virtual crossover of the charged particle beam is free of first-order dispersion and at or close to the plane.

16. The charged particle beam apparatus of claim 15, wherein the beam adjustment element of the monochromator is on a beam entrance side of the first dispersion unit of the monochromator.

17. The charged particle beam apparatus of claim 16, wherein the beam adjustment element of the monochromator is a round lens.

18. The charged particle beam apparatus of claim 17, wherein the first dispersion unit of the monochromator comprises a first Wien filter and a first stigmator which compensates astigmatism generated by the first Wien filter, and the second dispersion unit of the monochromator comprises a second Wien filter and a second stigmator which compensates astigmatism generated by the second Wien filter.

19. The charged particle beam apparatus of claim 18, wherein an exit energy spread of the charged particle beam after exiting from the monochromator can be changed by simultaneously changing the dispersion powers of the first and second dispersion units in terms of the proportional relationship and a focusing power of the beam adjustment element.

20. The charged particle beam apparatus of claim 18, wherein an exit energy spread of the charged particle beam after exiting from the monochromator can be changed by adjusting the particle-blockage unit to choose the corresponding position and dimensions of the spatial area of the real crossover.

21. The charged particle beam apparatus of claim 15, further comprising a first plate with a first beam-limit aperture between the charged particle source and the condenser, and a second plate with a second beam-limit aperture between the condenser and the objective lens, wherein the first and second beam-limit apertures are aligned with the optical axis of the apparatus.

22. The charged particle beam apparatus of claim 21, wherein the monochromator is between the first plate and the condenser.

23. The charged particle beam apparatus of claim 21, wherein the monochromator is between the second plate and the objective lens.

24. A monochromator, comprising:
a first dispersion unit and a second dispersion unit both aligned with a straight optical axis of the monochromator and configured to in sequence deflect charged particles of the charged particle beam propagating along the optical axis, each of said dispersion units having a dispersion power in a dispersion direction, thereby deflecting each particle a deflection angle which depends on said dispersion power and difference between energy of said particle and a normal energy of the charged particle beam, wherein the dispersion directions of the first and second dispersion units are same; and
a particle-blockage unit between the first and second dispersion units,
wherein the charged particle beam forms a real crossover at a plane inside the particle-blockage unit,
wherein inside the real crossover each particle with energy deviation has a position shift due to said deflection angle generated by the first dispersion unit,
wherein the particle-blockage unit cuts off particles located outside a spatial area of the real crossover,
wherein the dispersion power of the second dispersion unit makes the charged particle beam form a virtual crossover free of first-order dispersion and at or close to the plane.

25. The monochromator of claim 24, wherein the particle-blockage unit uses an aperture to cut off particles.

26. The monochromator of claim 24, wherein the particle-blockage unit uses a first knife-edge to cut off particles.

27. The monochromator of claim 26, wherein the particle-blockage unit further uses a second knife-edge to cut off particles.

28. A method for energy-filtering a charged particle beam, comprising:
providing a particle-blockage means cutting off particles outside a spatial area of the charged particle beam;
providing a dispersion means generating a dispersion power in a dispersion direction so as to deflect each particle of the charged particle beam a deflection angle which depends on said dispersion power and difference between energy of said each particle and a normal energy of the charged particle beam; and
using the dispersion means to form a dual proportional-symmetry which comprises a proportional-symmetry in dispersion power distribution and a proportional-anti-symmetry in trajectory distribution of a charged particle having a normal energy both with respect to a plane,
wherein the dual proportional-symmetry at first makes the charged particle beam form a real crossover at the plane and with a particle position distribution in dependence upon energy distribution of the charged particle beam, and the particle-blockage means makes particles outside a spatial area of the real crossover blocked out,
wherein the dual proportional-symmetry then makes the charged particle beam form a virtual crossover which is free of first-order dispersion and has a reduced energy spread.

29. The method of claim 28, wherein the virtual crossover is at or close to the plane.

30. A method for reducing an energy spread of a charged particle beam, comprising:
step of dispersing the charged particle beam, wherein each particle thereof obtains a deflection angle in dependence upon energy deviation thereof from a normal energy of the charged particle beam;
step of focusing the dispersed charged particle beam to form a real crossover;
step of blocking out particles outside a specific spatial area of the real crossover; and
step of dispersing non-blocked charged particle beam so as to form a virtual crossover free of first-order dispersion.

31. The method of claim 30, wherein the virtual crossover is at or close to the real crossover.

* * * * *